US011652131B2

(12) United States Patent
Lee et al.

(10) Patent No.: US 11,652,131 B2
(45) Date of Patent: May 16, 2023

(54) LAYOUT DESIGN OF DUAL ROW SELECT STRUCTURE

(71) Applicant: OMNIVISION TECHNOLOGIES, INC., Santa Clara, CA (US)

(72) Inventors: Sang Joo Lee, Sunnyvale, CA (US); Rui Wang, San Jose, CA (US); Hiroaki Ebihara, San Jose, CA (US); Tiejun Dai, Santa Clara, CA (US); Hiroki Ui, Yokohama (JP)

(73) Assignee: OmniVision Technologies, Inc., Santa Clara, CA (US)

( * ) Notice: Subject to any disclaimer, the term of this patent is extended or adjusted under 35 U.S.C. 154(b) by 238 days.

(21) Appl. No.: 17/066,277

(22) Filed: Oct. 8, 2020

(65) Prior Publication Data

US 2021/0358994 A1 Nov. 18, 2021

Related U.S. Application Data

(60) Provisional application No. 63/025,883, filed on May 15, 2020.

(51) Int. Cl.
*H01L 27/146* (2006.01)
*H04N 5/378* (2011.01)
(Continued)

(52) U.S. Cl.
CPC .. *H01L 27/14645* (2013.01); *H01L 27/14612* (2013.01); *H01L 27/14641* (2013.01);
(Continued)

(58) Field of Classification Search
CPC ........ H01L 27/14645; H01L 27/14612; H01L 27/14641; H01L 27/14812;
(Continued)

(56) References Cited

U.S. PATENT DOCUMENTS 11,477,406 B2 * 10/2022 Ashitani ................ H04N 5/341
2017/0302872 A1 * 10/2017 Tanaka ................... H04N 5/374
(Continued)

FOREIGN PATENT DOCUMENTS

TW 201310630 A 3/2013

OTHER PUBLICATIONS

Office Action and Search Report for ROC (Taiwan) Patent Application No. 110117446, dated Feb. 23, 2022 (18 pages, with Translation).

*Primary Examiner* — Abdelaaziz Tissire
(74) *Attorney, Agent, or Firm* — Perkins Coie LLP

(57) ABSTRACT

A pixel array includes pixel cells disposed in semiconductor material. Each of the pixel cells includes photodiodes, and a floating diffusion to receive image charge from the photodiodes. A source follower is coupled to the floating diffusion to generate an image signal in response image charge from the photodiodes. Drain regions of first and second row select transistors are coupled to a source of the source follower. A common junction is disposed in the semiconductor material between gates of the first and second row select transistors such that the drains of the first and second row select transistors are shared and coupled together through the semiconductor material of the common junction. The pixel cells are organized into a rows and columns with bitlines.

39 Claims, 11 Drawing Sheets

(51) Int. Cl.
  *H04N 5/374* (2011.01)
  *H01L 27/148* (2006.01)
  *H04N 9/04* (2006.01)
  *H04N 5/347* (2011.01)
  *H04N 5/3745* (2011.01)

(52) U.S. Cl.
  CPC .. *H01L 27/14812* (2013.01); *H01L 27/14831* (2013.01); *H01L 27/14868* (2013.01); *H04N 5/347* (2013.01); *H04N 5/378* (2013.01); *H04N 5/3745* (2013.01); *H04N 9/0451* (2018.08); *H04N 9/04551* (2018.08); *H01L 27/14621* (2013.01)

(58) Field of Classification Search
  CPC ......... H01L 27/14831; H01L 27/14868; H01L 27/14621; H01L 27/14605; H01L 27/14643; H04N 5/347; H04N 5/3745; H04N 5/378; H04N 9/0451; H04N 9/04551; H04N 5/343; H04N 5/374
  See application file for complete search history.

(56) References Cited

U.S. PATENT DOCUMENTS

| | | | |
|---|---|---|---|
| 2018/0182794 A1* | 6/2018 | Go | H01L 27/14643 |
| 2018/0182804 A1* | 6/2018 | Lee | H04N 5/3745 |
| 2019/0019835 A1* | 1/2019 | Tanaka | H04N 9/04557 |
| 2020/0053309 A1* | 2/2020 | Takatsuka | H04N 5/3745 |
| 2020/0119082 A1 | 4/2020 | Lee et al. | |
| 2020/0219925 A1* | 7/2020 | Jang | H04N 5/37457 |
| 2021/0044771 A1* | 2/2021 | Kwag | H04N 5/37457 |

* cited by examiner

LAYOUT DESIGN OF DUAL ROW SELECT STRUCTURE

CROSS REFERENCE TO RELATED APPLICATIONS

This application claims the benefit of U.S. Provisional Application No. 63/025,883, filed May 15, 2020, the contents of which are incorporated herein by reference.

This application is related to co-pending U.S. patent application Ser. No. 17/066,200, titled "Dual Row Select Pixel for Fast Pixel Binning" and concurrently filed Oct. 8, 2020.

BACKGROUND INFORMATION

Field of the Disclosure

This disclosure relates generally to image sensors, and in particular but not exclusively, relates to complementary metal oxide semiconductor (CMOS) image sensors with pixel binning.

BACKGROUND

Image sensors have become ubiquitous and are now widely used in digital cameras, cellular phones, security cameras, as well as, medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (i.e., image data) representing the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
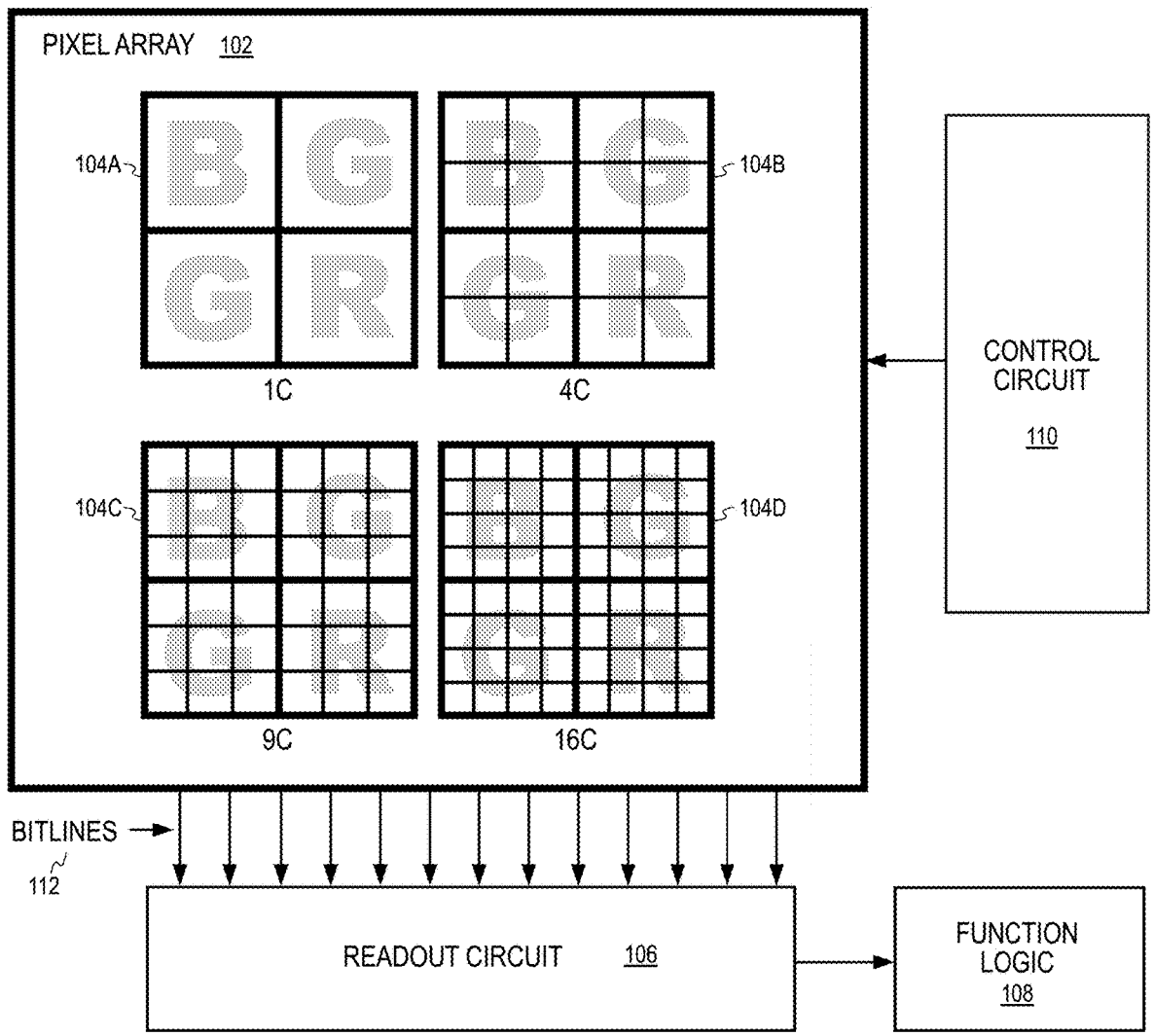
FIG. 1 illustrates one example of an imaging system including an array of pixel cells organized in a variety of different color patterns in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system with pixel cells including pixel cells with dual row select transistors that provide fast pixel binning are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with an array of pixel cells with dual row select pixels for fast pixel binning to support both high resolution image capture as well as high speed high definition (HD) video are disclosed. In various examples, 16C pixel cell arrangements are provided that utilize multiple shared pixel cell units with dual conversion gain, which therefore can provide improved lower noise performance. By limiting the number of photodiodes sharing the same floating diffusion (FD) within a shared pixel cell unit to up to 8 photodiodes, the shared pixel cell's conversion gain is higher while the FD capacitance kept lower. In various examples, the 16C pixel cell arrangements may be read out in 16C mode, which may be utilized for example for high speed HD video acquisition, or in 1C mode, which may be utilized for example for high resolution still image capture.

As will be shown in one example, in 16C mode, a left 2×4 shared pixel cell unit and a right 2×4 shared pixel cell unit of the same color are binned together to output a single image data signal for the same color (e.g., red, green, blue). In various examples, the left and right 2×4 shared pixel cell units are binned inside the pixel array with dual row select transistors for fast pixel binning to achieve a fast 16x frame rate relative to a 1C mode or full size pixel cells in accordance with the teachings of the present invention.

As the pixel sizes in image sensors have been decreasing, and as image sensor resolutions have been increasing, arrangements of color filter array patterns have been changing accordingly. For instance, pixel binning has become one approach to increase image sensor sensitivity by adding or combining image charges from multiple pixels as pixel sizes have decreased. With pixel binning, color filter array patterns can be grouped accordingly to accommodate for example 1C, 4C (e.g., 2×2), 9C (e.g., 3×3), 16C (e.g., 4×4), etc., configurations. With a 16C pixel cell arrangement in accordance with the teachings of the present invention, an image sensor can have the flexibility to provide different modes to support both high resolution still image capture, as well as high speed high definition (HD) video acquisition.

For small sub-micron pixels, a shared pixel structure may be utilized to account for limited pixel area. In some examples, multiple 2×2 or 2×4 unit shared pixel cell arrangements may be used in combination to form a 16C (e.g., 4×4) color filter pattern. Furthermore, the pixel cells can be single conversion gain (CG) pixel cells for normal dynamic range or the pixel cells can be dual conversion gain (DCG) pixel cells to provide high dynamic range acquisition. DCG pixel cells can be configured to provide both high conversion gain (HCG) for dim lighting conditions and low conversion gain (LCG) for bright lighting conditions. It is appreciated that one of the tradeoffs when choosing between high conversion gain for dim lighting conditions and low conversion gain for bright lighting conditions is that pixel cells that are configured for high conversion gain generally have less readout noise compared to pixel cells that are configured for low conversion gain. Thus, when given the option, one reason not to choose a 4×4 (e.g., 16C) shared pixel cell configuration over a smaller 2×2 (e.g., 4C) shared pixel cell configuration or a full size (e.g., 1C) mode configuration is to take advantage of the lower noise performance of the 1C or 4C configurations.

To illustrate, FIG. 1 illustrates generally one example of a complementary metal oxide semiconductor (CMOS) imaging system 100 including a color pixel array 102 with an array of pixel cells with dual row select pixels for fast pixel binning in accordance with an embodiment of the present disclosure. As shown in the depicted example, the imaging system 100 includes an image sensor with pixel array 102, a control circuit 110, a readout circuit 106, and function logic 108. In one example, pixel array 102 is a two-dimensional (2D) array of pixel cells.

For explanation purposes, the example depicted in FIG. 1 illustrates generally that an array of pixel cells may be organized in one of a variety of different color patterns. For instance, the array of color pixel cells 104A illustrates an example of a 1C Bayer (RGB) color filter pattern, which may be utilized for high resolution still image capture. Similarly, the array of color pixel cells 104B illustrates an example of a 4C (2×2) Bayer color filter pattern of red (R), green (G), and blue (B) color filters as shown. The array of color pixel cells 104C illustrates an example of a 9C (3×3) Bayer (RGB) color filter pattern. The array of color pixel cells 104D illustrates an example of a 16C (4×4) Bayer (RGB) color filter pattern, which may be utilized for example for high speed HD video capture. As will be described in greater detail, it is noted that with a 16C shared pixel cell 104D, imaging system 100 can provide different modes to support both high resolution still image capture, as well as high speed HD (high definition) video in accordance with the teachings of the present invention.

In shown in the depicted example, the pixel cells included pixel array 102 are arranged into rows and columns to acquire image data of a person, place, object, etc., which can then be used to render an image of a person, place, object, etc. After the photodiodes in the pixel cells of pixel array 102 have acquired their image charge, the corresponding analog image signals are read out by readout circuit 106 through column bitlines 112. In the various examples, readout circuit 106 includes an analog-to-digital conversion (ADC) circuits, which are coupled to convert the analog image signals received from the pixel cells 104 through bitlines 112 into digital image signals, which may be then transferred to function logic 108. Function logic 108 may simply store the image data or even manipulate the image data by applying post image processing or effects. Such image processing may, for example, include image processing, image filtering, image extraction and manipulation, determination of light intensity, crop, rotate, remove red eye, adjust brightness, adjust contrast, etc.

In one example, a control circuit 110 is coupled to pixel array 102 to control operational characteristics of pixel array 102. For instance, in one example, control circuit 110 generates the transfer gate signals and other control signals to control the transfer and readout of image data from the photodiodes included in the pixel cells of pixel array 102. In addition, control circuit 110 may generate a shutter signal for controlling image acquisition. In one example, the shutter signal may be a rolling shutter signal such that each row of the pixel array 102 is read out sequentially row by row during consecutive acquisition windows. In another example, the shutter signal may also establish an exposure time, which is the length of time that the shutter remains open. In one embodiment, the exposure time is set to be the same for each of the frames.

Figures 2A, 2B:
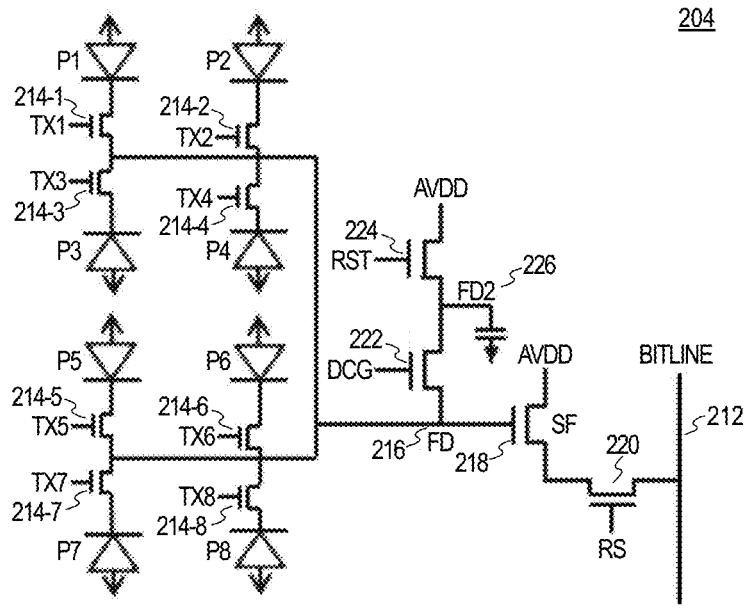
FIG. 2A illustrates one example of a 2×4 shared pixel cell with a dual conversion gain configuration included in a pixel array of an imaging system.
FIG. 2B illustrates a top view of a 16C color filter pattern utilized with 2×4 shared pixel cells included in a pixel array.

FIG. 2A illustrates one example of a 2×4 shared pixel cell 204 with a dual conversion gain configuration included in a pixel array of an imaging system. It is appreciated that the pixel cell 204 of FIG. 2A may be an example implementation of pixel cells that are included in the pixel array 102 of the image sensor 100 as shown in FIG. 1, including for example color pixel cells 104D, and that similarly named and numbered elements described above are coupled and function similarly below.

In the example depicted in FIG. 2A, pixel cell 204 includes a photodiode P1 coupled to a transfer transistor 214-1, a photodiode P2 coupled to a transfer transistor 214-2, a photodiode P3 coupled to a transfer transistor 214-3, a photodiode P4 coupled to a transfer transistor 214-4, a photodiode P5 coupled to a transfer transistor 214-5, a photodiode P6 coupled to a transfer transistor 214-6, a photodiode P7 coupled to a transfer transistor 214-7, and a photodiode P8 coupled to a transfer transistor 214-8. A floating diffusion FD 216 is coupled to transfer transistor 214-1, transfer transistor 214-2, transfer transistor 214-3, transfer transistor 214-4, transfer transistor 214-5, transfer transistor 214-6, transfer transistor 214-7, and transfer transistor 214-8.

Transfer transistor 214-1 is coupled to be controlled in response to a transfer control signal TX1, transfer transistor 214-2 is coupled to be controlled in response to a transfer control signal TX2, transfer transistor 214-3 is coupled to be controlled in response to a transfer control signal TX3, transfer transistor 214-4 is coupled to be controlled in response to a transfer control signal TX4, transfer transistor 214-5 is coupled to be controlled in response to a transfer control signal TX5, transfer transistor 214-6 is coupled to be controlled in response to a transfer control signal TX6, transfer transistor 214-7 is coupled to be controlled in response to a transfer control signal TX7, and transfer transistor 214-8 is coupled to be controlled in response to a transfer control signal TX8. As such, charge photogenerated in photodiode P1 in response to incident light is transferred to floating diffusion FD 216 in response to transfer control signal TX1, charge photogenerated in photodiode P2 in response to incident light is transferred to floating diffusion FD 216 in response to transfer control signal TX2, charge photogenerated in photodiode P3 in response to incident light is transferred to floating diffusion FD 216 in response to transfer control signal TX3, charge photogenerated in photodiode P4 in response to incident light is transferred to floating diffusion FD 216 in response to transfer control signal TX4, charge photogenerated in photodiode P5 in response to incident light is transferred to floating diffusion FD 216 in response to transfer control signal TX5, charge photogenerated in photodiode P6 in response to incident light is transferred to floating diffusion FD 216 in response to transfer control signal TX6, charge photogenerated in photodiode P7 in response to incident light is transferred to floating diffusion FD 216 in response to transfer control signal TX7, and charge photogenerated in photodiode P8 in response to incident light is transferred to floating diffusion FD 216 in response to transfer control signal TX8.

As illustrated in the depicted example, a reset transistor 224 and a dual conversion gain transistor 222 are coupled between a voltage supply (e.g., AVDD) and the floating diffusion FD 216. In the example, a second floating diffusion FD2 226 is coupled to the node between reset transistor 224 and dual conversion gain transistor 222. A gate of a source follower transistor SF 218 is coupled to the floating diffusion FD 216. The drain of the source follower transistor SF 218 is coupled to a voltage supply (e.g., AVDD). A row select transistor 220 is coupled to a source of the source follower transistor SF 218. In operation, the row select transistor 220 is coupled to output a data signal (e.g., image data) from the source follower transistor SF 218 of pixel cell 204 to a bitline 212 in response to a row select signal RS.

In one example, pixel cell 204 is configured for high conversion gain (HCG) when the dual conversion gain transistor 222 is deactivated or off, such that the floating diffusion FD 216 stores the image charge photogenerated in the photodiode(s) in response to incident light. In the example, pixel cell 204 is configured for low conversion gain (LCG) when the dual conversion gain transistor 222 is activated or on, such that both the floating diffusion FD 216 and the second floating diffusion FD 226 store the image charge photogenerated in the photodiode(s) in response to incident light.

In various examples, the photodiodes of the pixel array are binned, including photodiodes P1, P2, P3, P4, P5, P6, P7, P8. In other words, the image charge information generated from each photodiode is summed with image charge information generated from one or more other photodiodes to generate combined information, and therefore sum the performance of each individual photodiode to improve the performance of the pixel array. For instance, in various examples, 2×2 or 2×4 groupings of photodiodes may be configured to be binned such that the plurality of photodiodes included in each binned grouping all share the same color. As such, in a 2×4 shared pixel example, the 8 photodiodes are arranged in the pixel array such that each 2×4 grouping of image sensing photodiodes is either red, green, or blue. In one example, the 2×4 groupings of binned photodiodes may all be adjacent or neighboring photodiodes in the pixel array and share the same color filter. In a 2×2 example, the 2×2 groupings of the 4 binned photodiodes may all share the same color.

FIG. 2B shows a top view of an example 16C color filter pattern utilized with arrangements of two 2×4 shared pixel cells side-by-side included in a pixel array. It is appreciated that the 16C color filter example illustrated in FIG. 2B may be utilized with a plurality of 2×4 shared pixel cells 204 as illustrated in FIG. 2A. As shown in the example depicted in FIG. 2B, the 16C color filter pattern is a 16C Bayer color filter pattern with 16C groupings of red (R), green (G), and blue (B) color filters. In the depicted example, each 16C grouping may include a left 2×4 shared pixel cell and a right 2×4 shared pixel cell that are similar to the pixel cell 204 illustrated in FIG. 2A. As such, the blue (B) 16C grouping includes a left 2×4 grouping 204BL and a right 2×4 grouping 204BR. The green (G) 16C grouping in the same row as the blue (B) 16C grouping includes a left 2×4 grouping 204GBL and a right 2×4 grouping 204GBR. The red (R) 16C grouping includes a left 2×4 grouping 204RL and a right 2×4 grouping 204RR. The green (G) 16C grouping in the same row as the red (R) 16C grouping includes a left 2×4 grouping 204GRL and a right 2×4 grouping 204GRR. As shown, each 2×4 grouping includes 8 color filters numbered 1-8, which correspond to underlying photodiodes P1-P8. In 16C mode, the left 2×4 shared pixel cell and the right 2×4 shared pixel cell of the same color (e.g., red, green, blue) are binned together to output a single image data signal for the same color.

Figure 3A:
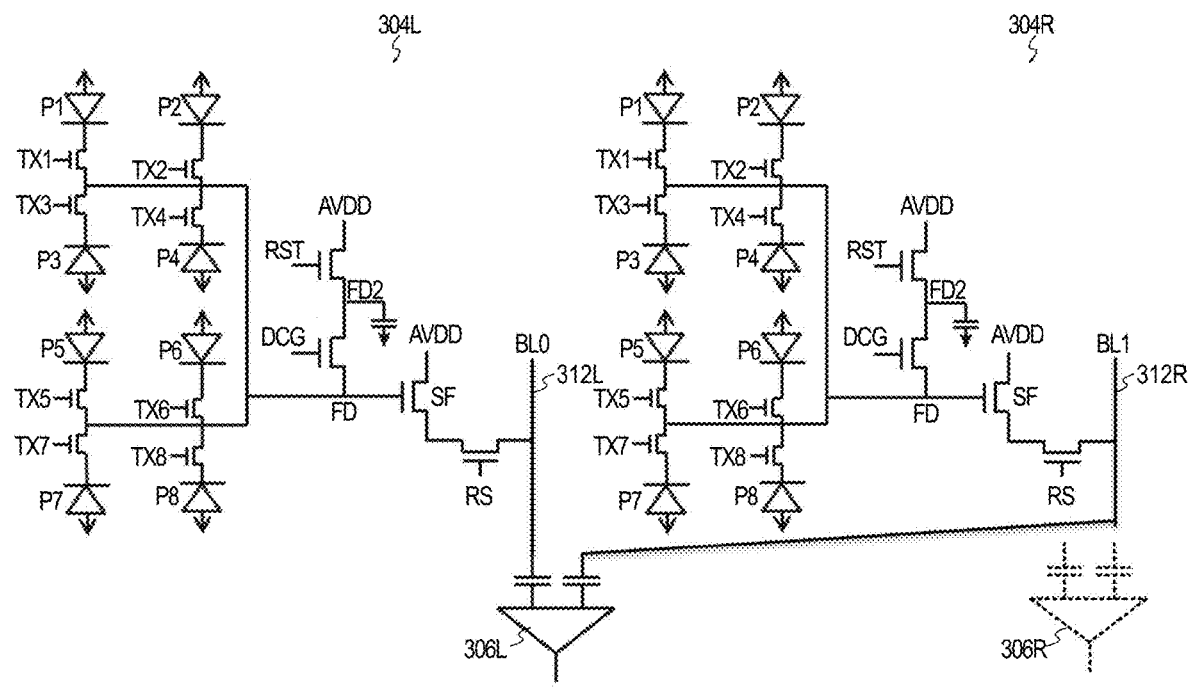
FIG. 3A illustrates an example arrangement of two 2×4 shared pixel cells included in a pixel array with binning provided at one of the column ADCs.

FIG. 3A shows an example of a 16C arrangement of shared pixel cells included in a pixel array with horizontal analog binning implemented inside a column analog to digital converter (ADC) through capacitor charge sharing. As shown in the depicted example, the 16C arrangement includes a left 2×4 shared pixel cell 304L and a right 2×4 shared pixel cell 304R that are each coupled to a respective bitline BL0 312L and BL1 312R. It is appreciated that the pixel cells 304L and 304R may be examples of pixel cell 204, which is described in detail above in connection with FIG. 2A, and that similarly named and numbered elements described above are coupled and function similarly below. Further, it is appreciated therefore that the coupling and operation of shared pixel cells 304L and 304R are not be described again in detail for the sake of brevity.

In full size (1C) or 4C readout mode, the image data signal from the left and right 2×4 shared pixel cells 304L and 304R are read out at the same time or simultaneously through respective bitlines BL0 312L, BL1 312R, which are coupled to two column ADC circuits 306L, 306R, respectively. In the various examples, the column ADC circuits may be included in a readout circuit (e.g., readout circuit 106) to convert the image signals in the respective bitlines BL0 312L, BL1 312R to digital image signals. However, in a 16C readout mode, column ADC 306L is coupled to both bitline BL0 312L and bitline BL1 312R to implement horizontal analog binning inside column ADC 306L through capacitor charge sharing. As a result, column ADC 306R is inactive during this 16C readout mode, as shown with inactive column ADC 306R illustrated with dashed lines FIG. 3A.

In a 16C readout mode, each 2×4 shared pixel cell 304L and 304R has the charge binned image data signal from its 8 photodiodes P1-P8 at its floating diffusion (FD), and this signal is read out through its bitline BL0 312L and BL1 312R. The two signals from left shared pixel cell 304L and right shared pixel cell 304R on bitlines BL0 312L and BL1 312R are then averaged through charge sharing in the column ADC 306L. For every ADC in this example, two bitlines are needed for analog binning in 16C mode as shown in FIG. 3A. The other ADC (e.g., ADC 306R to the right in FIG. 3A) that is active in full size (1C) or 4C mode is now inactive in 16C mode. As a consequence, the image sensor's output data rate in 16C mode is only half of output data rate of the full size (1C) or 4C mode. To fully utilize all ADCs, and keep the frame rate of 16C mode 16 times of full size, the number of bitlines should be doubled. Similarly, in a 16C mode configuration that utilizes 2×2 shared pixel cells (e.g., four 2×2 shared pixel cells for 16C) for binning, in order to fully utilize the ADCs and keep frame rate 64 times of full size, the number of active bitlines should therefore be 4 times that of full size (1C), or one bitline for each of the four shared 2×2 shared pixel cells.

In an example of a 200 megapixel sensor having an image resolution of 16384×12288, for a whole row (e.g., 16384 pixels) of column ADCs, 16384 bitlines are needed. To support 16C mode and 16C 2×2 binning mode with same data rate as full size (1C), 65536 bitlines in total are needed, or 4 bitlines per pixel pitch. For small pixels (such as for example 0.61 um), this requires extra metal layer(s), which increase the cost. The reduced metal spacing between bitlines and their neighboring metal traces also increase the bitline capacitance, which slows down the sensor readout performance.

Figure 3B:
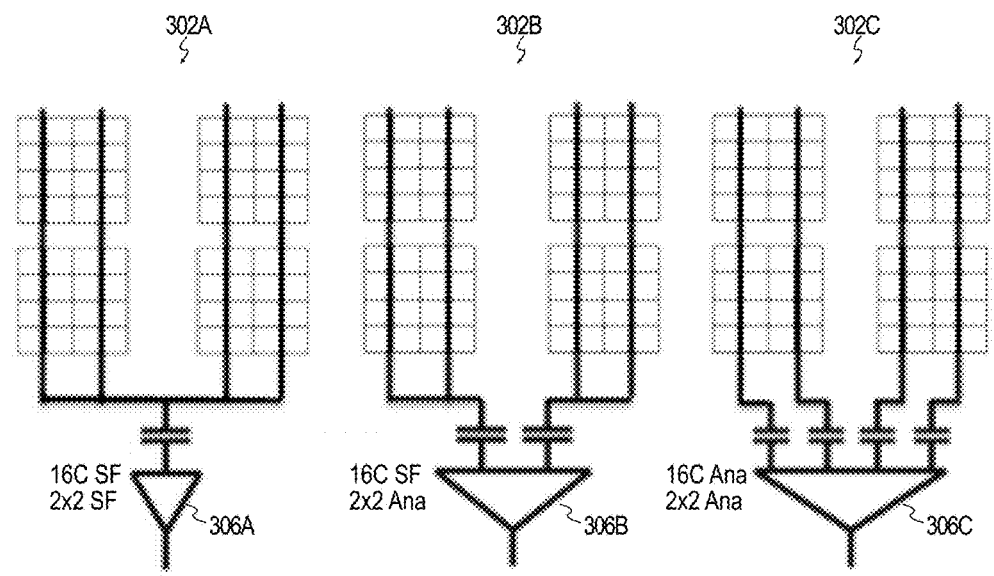
FIG. 3B illustrates various examples of pixel arrays of shared pixel cells with various binning configurations.

In another example of a 3 megapixel sensor configured in 1080p mode or 720p mode with 1/8 down sampling, it is noted that only 4 multiples of rows can be readout together with 4 bitlines per 2×4 shared pixel cell. In addition, only 2 multiples of rows can be readout together with 2 bitlines per 2×4 shared pixel cell. FIG. 3B further illustrates an example of pixel arrays 302A, 302B, 302C with 16C mode and 2×2 shared pixel cell configurations. As shown with pixel array 302A with binning performed at the source followers and 2×2 shared pixel cells, the equivalent source follower size is 8×, the metal capacitance Cm is 4×, and the metal resistance Rm is 1/4. Pixel array 302B with some source follower binning and some analog binning and 2×2 shared pixel cells, the equivalent source follower size is 4×, the metal capacitance Cm is 2×, and the metal resistance Rm is 1/2. Similarly, pixel array 302C with analog binning and 2×2 shared pixel cells, the equivalent source follower size is 2×, the metal capacitance Cm is 1×, and the metal resistance Rm is 1×. Therefore, it is appreciated that there is no meaningful difference in speed because the RC time constants regarding pixel arrays 302A, 302B, 302C are substantially equal (i.e., $(4)\cdot(1/4)=(2)\cdot(1/2)=(1)\cdot(1)$).

Figure 4A:
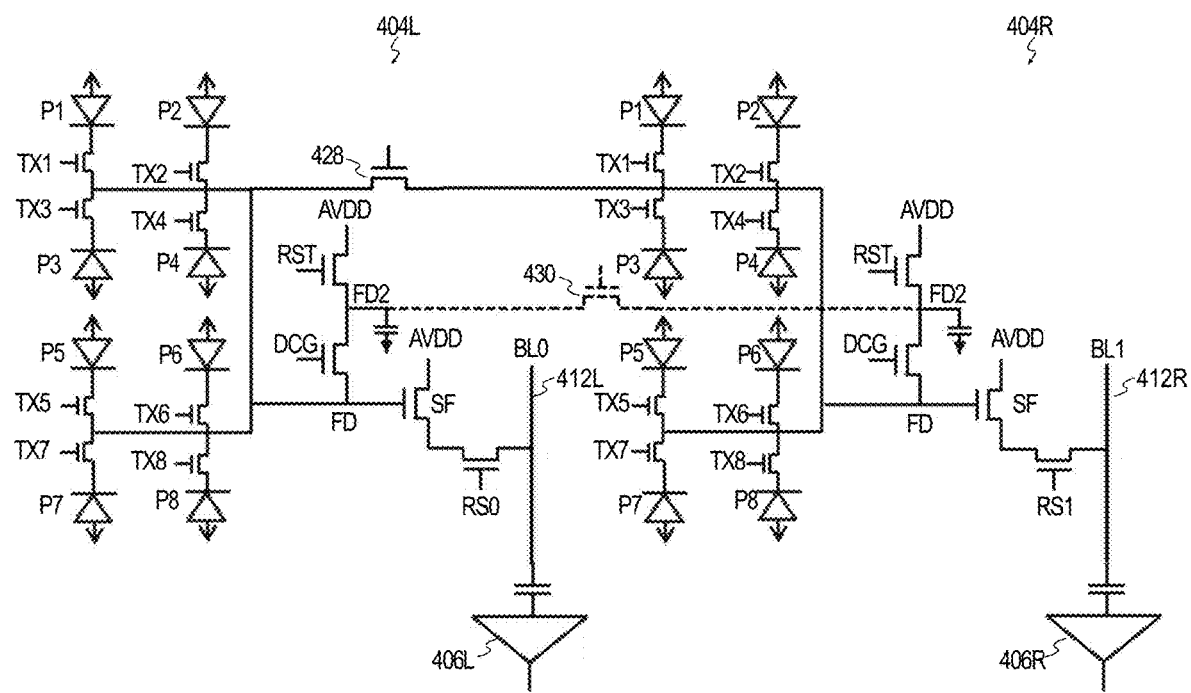
FIG. 4A shows another example illustrating an arrangement of shared pixel cells included in pixel arrays with binning implemented with in-pixel charge sharing provided with transistors coupling the floating diffusions.

FIG. 4A shows another example illustrating a 16C arrangement of shared pixel cells including a left 2×4 shared pixel cell 404L and a right 2×4 shared pixel cell 404R included in a pixel array with binning implemented with in-pixel charge sharing provided with transistors coupling together the floating diffusions of the shared pixel cells 404L and 404R. It is appreciated that the pixel cells 404L and 404R may also be examples of pixel cell 204, which is described in detail above in connection with FIG. 2A, and that similarly named and numbered elements described above are coupled and function similarly below. Further, it is appreciated therefore that the coupling and operation of shared pixel cells 404L and 404R are not be described again in detail for the sake of brevity.

As shown in the depicted example, pixel cells 404L and 404R are dual conversion gain (DCG) configurations as they both include DCG transistors. Thus, for a DCG pixel, there are two floating diffusions, FD for HCG and FD+FD2 for LCG. The charge binning is through an extra transistor 428 that is coupled between the FD of the two pixel cells 404L and 404R, or an extra transistor 430 that is coupled between the second floating diffusion FD2 of the two pixel cells 404L and 404R. With FD charge binning, the binned signal can be readout through a single bitline. For every column ADC, one bitline is needed. In the example depicted in FIG. 4A, the left 2×4 shared pixel cell 404L and the right 2×4 shared pixel cell 404R should each have separate row select controls, as depicted with row select signal RS0 for the left pixel cell 404L and row select signal RS1 for the right pixel cell 404R, so that each bitline can separately be used to simultaneously to read another row to achieve the frame rate in 16C mode.

As shown, extra transistor(s) 428, 430 and the extra row control wires that provide row select signal RS0 and RS1 are needed, which may be difficult to realize in small pixels. Furthermore, the coupling between the two shared pixels 404L and 404R at the two floating diffusions results in lower conversion gain when connected in 16C mode, which will harm the readout noise performance.

Figure 4B:
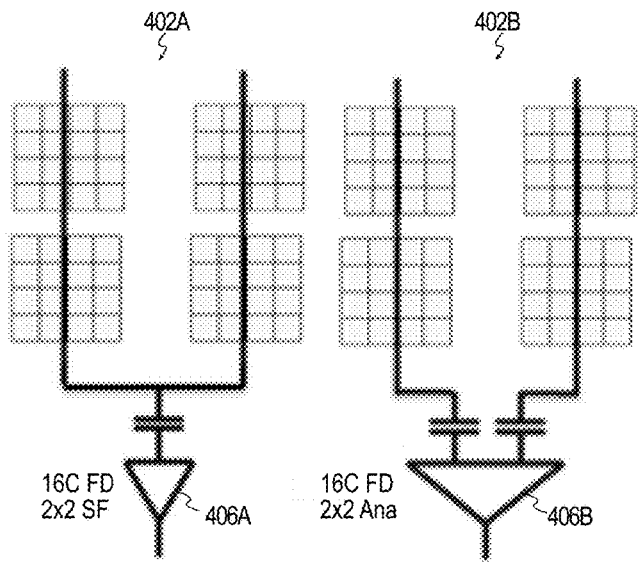
FIG. 4B illustrates various additional examples of pixel arrays of shared pixel cells with various binning configurations.

In yet another example of a 3 megapixel sensor configured in 1080p mode or 720p mode with 1/8 down sampling, it is noted that 8 multiples of rows can be readout together with 4 bitlines per 2×4 shared pixel cell. In addition, 4 multiples of rows can be readout together with 2 bitlines per 2×4 shared pixel cell. FIG. 4B further illustrates another example of pixel arrays 402A, 402B with 16C mode connected floating diffusion provided binning configurations. As shown with pixel array 402A with 16C mode binning performed with connected floating diffusions and 2×2 shared pixel cell source followers, the equivalent source follower size is 4×, the metal capacitance Cm is 2×, and the metal resistance Rm is 1/2. Pixel array 402B with 16C mode binning performed with connected floating diffusions and 2×2 shared pixel cell analog binning provided with capacitor charge sharing at the ADC 406B, the equivalent source follower size is 2×, the metal capacitance Cm is 1×, and the metal resistance Rm is 1×. Therefore, it is appreciated that there is no meaningful difference in speed because the RC time constants regarding pixel arrays 402A, 402B are substantially equal (i.e., (2)·(1/2)=(1)·(1)).

Figure 5:
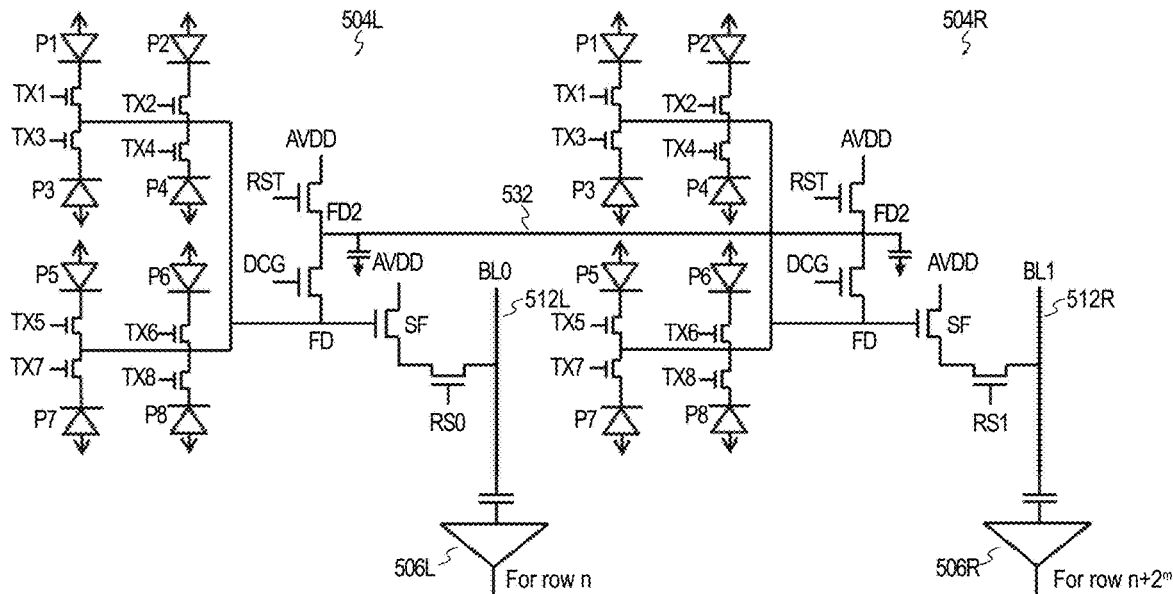
FIG. 5 shows still another example illustrating an arrangement of shared pixel cells included in a pixel array with binning implemented with a metal line coupling the floating diffusions of the shared pixel cells.

FIG. 5 shows yet another example illustrating a 16C arrangement of shared pixel cells including a left 2×4 shared pixel cell 504L and a right 2×4 shared pixel cell 504R included in a pixel array with binning implemented with in-pixel charge sharing provided with a metal connection that couples together the floating diffusions of pixel cells 504L, 504R to each other. It is appreciated that the pixel cells 504L and 504R may also be examples of pixel cell 204, which is described in detail above in connection with FIG. 2A, and that similarly named and numbered elements described above are coupled and function similarly below. Further, it is appreciated therefore that the coupling and operation of shared pixel cells 504L and 504R are not be described again in detail for the sake of brevity.

As shown, FIG. 5 illustrates the second floating diffusion FD2 binning is provided by removing the transistors 428 and 430 shown in FIG. 4A. Instead, FIG. 5 shows that the floating diffusions FD2 of pixel cells 504L and 504R are directly electrically coupled together with a metal line or metal connection 532. Although the extra binning transistor is removed compared to the example depicted in FIG. 4A, the example shown in FIG. 5 illustrates that binning is provided for dual conversion gain pixels and that the lower conversion gain is lower than single 2×4 dual conversion gain pixel's LCG readout due to the shared two floating diffusions FD2 through the metal connection 532.

As shown in the example depicted in FIG. 5, the bitline BL0 512L of the left pixel cell 504L is used to readout row n in response to row select signal RS0, and the bitline BL1 512R of the right pixel cell 504R is used to simultaneously readout another different row n+2m. Readout speed can be therefore doubled compared to analog binning. However, in addition to the extra row select control wire (e.g., row select signal RS1 in addition to row select signal RS0), there is also a coupling capacitance between floating diffusion FD and the respective bitline in the configuration illustrated in FIG. 5. As a consequence, the voltage on bitline BL1 512R may be capacitively coupled (through the capacitance of the row select transistor coupled to receive row select signal RS1) to the FD, and result in unwanted crosstalk, which affects the voltage on bitline BL0 512L through metal connection 532. Thus, performance will be deteriorated.

Figure 6:
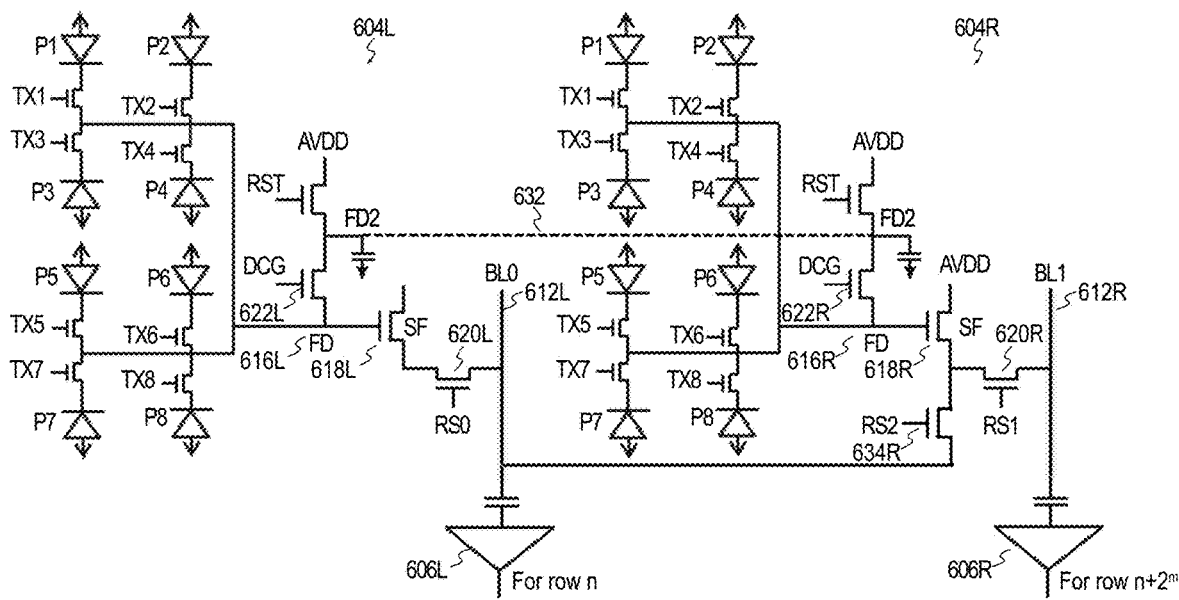
FIG. 6 shows an example illustrating an arrangement of shared pixel cells included in a pixel array with binning implemented with a second row select transistor coupling a source follower from one of the pixel cells to a bitline of another pixel cell in accordance with the teachings of the present invention.

Therefore, in order to reduce crosstalk and improve performance, FIG. 6 is an illustration of another configuration illustrating a 16C arrangement of shared pixel cells including a left 2×4 shared pixel cell 604L and a right 2×4 shared pixel cell 604R included in a pixel array with binning implemented with dual row select transistors in accordance with the teachings of the present invention. It is noted that the example depicted in FIG. 6 describes 2x4 arrangements of photodiodes for explanation purposes, but that in other examples, different arrangements of photodiodes, such as a 2×2 arrangements of photodiodes, etc., may be included in the shared pixel cells in accordance with the teachings of the present invention. It is also appreciated that the pixel cells 604L and 604R illustrated in the example of FIG. 6 share some similarities with pixel cell 204, which is described in detail above in connection with FIG. 2A, and that the similarly named and numbered elements described above are coupled and function similarly below. Further, it is appreciated therefore that the coupling and operation of shared pixel cells 604L and 604R are not be described again in complete detail for the sake of brevity.

In the example depicted in FIG. 6, the crosstalk between bitline BL0 612L of the left shared pixel cell 604L and bitline BL1 612R of the right shared pixel cell 604R is significantly reduced or eliminated when compared to the example depicted in FIG. 5. In particular, the example shows that metal connection 632 that directly couples together the floating diffusions of shared pixel cells 604L, 604R is no longer required and is instead optional, as indicated with a dashed line in FIG. 6. When metal connection 632 is removed, the crosstalk discussed above is significantly reduced or eliminated, and performance is improved compared to the example described in FIG. 5. Instead, binning is provided in the example depicted in FIG. 6 with the inclusion a second row select transistor 634R in addition to the first row select transistor 620R in the pixel cell 604R. Without the metal connection 632, both the HCG and the LCG mode readouts are binned through the two source followers 618L, 618R. As shown in the depicted example, a second row select transistor 634R is coupled between source follower SF 618R of pixel cell 604R and the bitline BL0 612L of pixel cell 604L. As such, the drain regions of first row select transistor 620L and second row select transistor 634R are both coupled to the source region of source follower SF 618R. As will be discussed in greater detail below, in one example, the source region of the source follower SF 618R is a split source junction region that is split into the drains regions of first row select transistor 620R and second row select transistor 634R. Stated in another way, the drain regions of the first row select transistor 620R and second row select transistor 634R are shared a common junction in the semiconductor material with the split source junction region of the source follower SF 618R. In another example, the drains of first row select transistor 620R and second row select transistor 634R may be coupled together with a metal connection.

In another example in which optional metal connection 632 is included, which couples together the two second floating diffusions FD2, true binning of the second floating diffusions FD2 of the 16 photodiodes is provided for an LCG mode readout when the dual conversion gain transistors 622L, 622R are turned on. In the LCG mode, which is when the dual conversion gain transistors 622L, 622R are turned on, the effective source follower size doubles and bitline settles faster when compared to a single source follower transistor.

When the dual conversion gain transistors 622L, 622R are turned off, an HCG mode readout can be achieved with binning with the second row select transistor 620R turned on, which enables binning through the two source follower transistors 618L, 618R to provide a binning signal of the 8 respective photodiodes from both 2×4 shared pixel cells 604L, 604R in accordance with the teachings of the present invention.

When metal connection 632 is not included and when reading out row n through bitline BL0 612L, bitline BL1 612R of pixel cell 604R and the floating diffusion FD 616L of pixel cell 604L are isolated from one another as the row select transistor 620R is turned off in response to row select signal RS1, which eliminates the crosstalk issue suffered by the example shown in FIG. 5. When the second row select transistor 634R turned on in response to the row select signal RS2 to provide binning, the metal line 632 is not needed to provide binning. In other words, the left pixel cell 604L and the right pixel cell 604R are binned through their source follower transistors 618L, 618R and through the second row select transistor 634R when turned on in response to the row select signal RS2. In addition, it is further appreciated that by not including metal connection 632, the gain of the LCG readout mode is not further reduced by the direct coupling together of the two floating diffusions, which therefore provides improved readout performance. It is noted that in another example, the inclusion of a second row select transistor 634R as discussed can also be implemented in a single conversion gain pixel cell implementation, without dual conversion gain transistors 622L and 622R, to provide binning in accordance with the teachings of the present invention.

Figure 7:
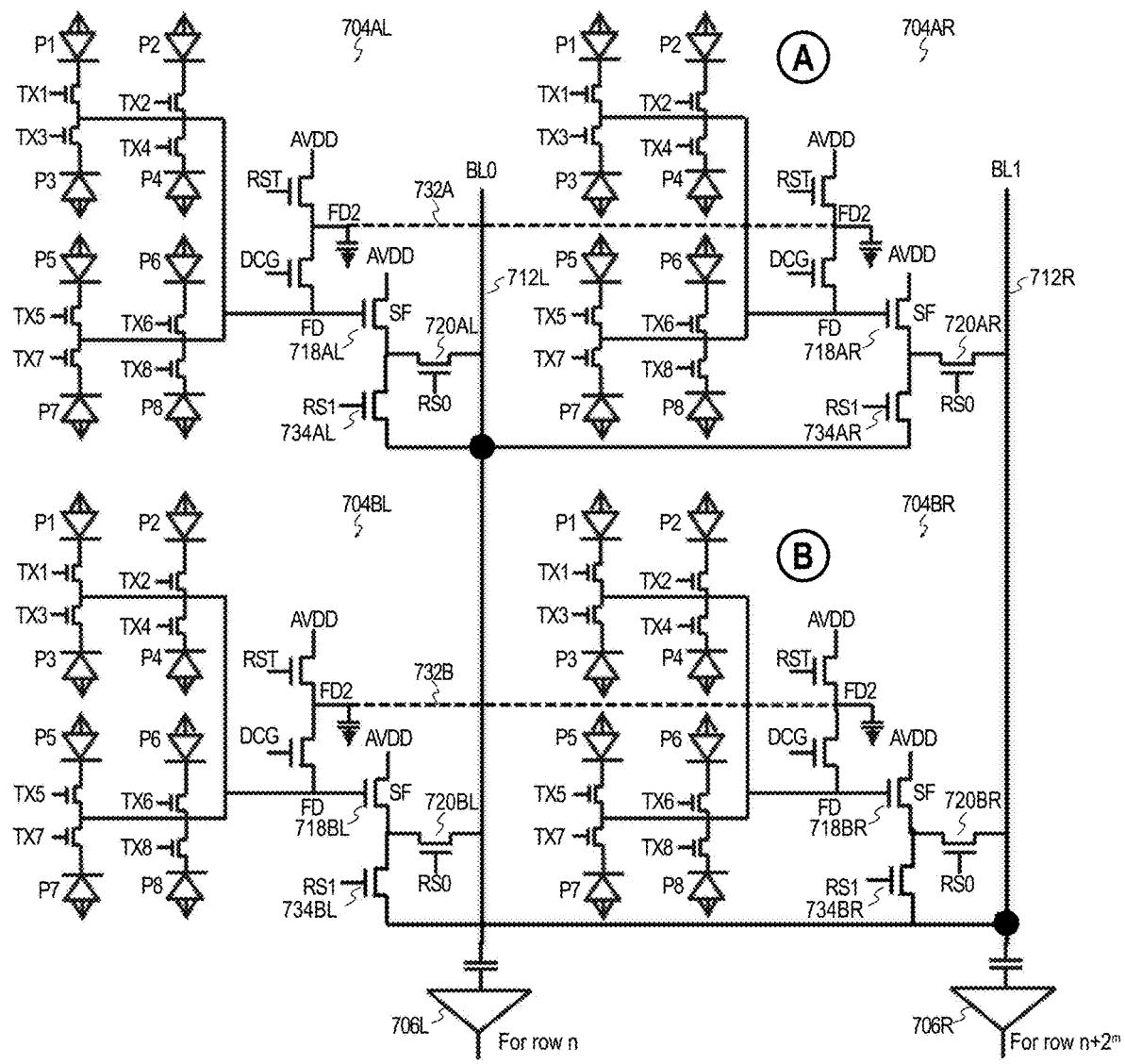
FIG. 7 shows another example illustrating an arrangement of several rows of shared pixel cells included in a pixel array with binning implemented with second row select transistors coupling source followers from pixel cells to bitlines of other pixel cells to provide binning in accordance with the teachings of the present invention.

FIG. 7 is an illustration of yet another configuration illustrating a 16C arrangement of several rows of shared pixel cells including left 2×4 shared pixel cells 704AL, 704BL and right 2×4 shared pixel cells 704AR, 704BR included in a pixel array with binning implemented with dual row select transistors in accordance with the teachings of the present invention. It is noted that the example depicted in FIG. 7 describes 2×4 arrangements of photodiodes for explanation purposes, but that in other examples, different arrangements of photodiodes, such as a 2×2 arrangements of photodiodes, etc., may be included in the shared pixel cells in accordance with the teachings of the present invention. It is also appreciated that the pixel cells 704AL, 704AR, 704BL, 704BR share some similarities with pixel cell 204, which is described in detail above in connection with FIG. 2A, and that the similarly named and numbered elements described above are coupled and function similarly below. Further, it is appreciated therefore that the coupling and operation of shared pixel cells 704AL, 704AR, 704BL, 704BR are not be described again in complete detail for the sake of brevity.

It is also appreciated that the arrangement illustrated in FIG. 7 also shares some similarities with the example illustrated in FIG. 6. However, in order to keep left shared pixel cells 704AL, 704BL and right shared pixel cells 704AR, 704BR layouts symmetric compared to the shared pixel cells illustrated in FIG. 6, each of the shared pixel cells 704AL, 704AR, 704BL, 704BR illustrated in FIG. 7 includes a respective first row select transistor 720AL, 720AR, 720BL, 720BR and a respective second row select transistor 734AL, 734AR, 734BL, 734BR. As shown in the example, the drain regions of both of the first and second row select transistors 720AL/734AL, 720AR/734AR, 720BL/734BL, 720BR/734BR for each respective 2×4 shared pixel cells 704AL, 704AR, 704BL, 704BR are coupled to the respective source regions of respective source follower transistors 718AL, 718AR, 718BL, 718BR of the respective pixel cell. As will be described in greater detail below, in one example, the first and second row select transistors 720AL/734AL, 720AR/734AR, 720BL/734BL, 720BR/734BR share a drain region that is coupled to the respective split source junction regions of respective source follower transistors 718AL, 718AR, 718BL, 718BR of the respective pixel cell. In another example, the drain regions of the first and second row select transistors 720AL/734AL, 720AR/734AR, 720BL/734BL, 720BR/734BR may be coupled together with metal lines.

As shown in the depicted example, there are two variations of the 2×4 shared pixel cells 704AL, 704AR, 704BL, 704BR. In particular, shared pixel cells 704AL and 704AR are included in an A-cell layout and pixel cells 704BL and 704BR are included in a B-cell layout in the example depicted in FIG. 7. In the A-cell, the binning row select transistors 734AL, 734AR are coupled to the left bitline BL0 712L in response to row select signal RS1. In the B-cell, the binning row select transistors 734BL, 734BR are coupled to the right bitline BL1 712R in response to row select signal RS1. In various examples, the pixel cells alternate between A-cells and B-cells for each consecutive row in a column. In other words, the pixel cells are organized in a repeating pattern of A-cell, B-cell, A-cell, B-cell, . . . , etc., for each column.

Stated in another way, in various examples, each column of pixel cells may be organized into two subgroups of pixel cells. In one example, the first subgroup includes every other row of pixel cells, and the second subgroup includes the remaining every other row of pixel cells that are not included in the first subgroup. Thus, the A-cells may be included in the first subgroup of pixel cells, and the B-cells may be included in the remaining second subgroup of pixel cells.

The example illustrated in FIG. 7 shows that each of the shared pixel cells 704AL, 704AR, 704BL, 704BR includes two row select transistors 720AL/734AL, 720AR/734AR, 720BL/734BL, 720BR/734AR, which are coupled to be controlled with separate row select signals of RS0 and RS1.

When read out in full-sized (1C) or 4C mode, the first row select signal RS0 is activated for both left 704AL, 704BL and right 704AR, 704BR shared pixels, and their respective image signals at the floating diffusions FD are readout separately through two bitlines BL0 712L, BL1 712R at the same time or simultaneously.

When read out in 16C mode with 2×4 shared pixel cells, or in another example in 16C mode with 2×2 shared pixel cells (e.g., four 2×2 shared pixel cells in a 16C arrangement) binning mode, the second row select signal RS1 is activated for both left 704AL, 704BL and right 704AR, 704BR shared pixels so that the second row select transistors 734AL/ 734AR for the A-cell and 734BL/734BR for the B-cell connect to the same respective bitline 712L/712R. To illustrate, in the top row in FIG. 7, which shows the A-cell, the row select signal RS1 couples the pixel cells 704AL, 704AR to the left bitline BL0 712L. For another row, such as in the bottom row in FIG. 7, which shows the B-cell, the row select signal RS1 couples the pixel cells 704BL, 704BR to the right bitline BL1 712R, such that the loading on both bitlines BL0 712L, BL1 712R is the same. Therefore, two 16C binned signals are read out simultaneously through the two separate bitlines BL0 712L, BL1 712R and the two column ADCs 706L, 706R so the data rate in 16C mode is 16 times that of a full size (1C) readout, without increasing the number of the bitlines in accordance with the teachings of the present invention.

In another example when reading out in 16C binning mode with 2×2 shared pixel cells (e.g., four 2×2 shared pixel cells per 16C arrangement), the number of bitlines can be doubled from 2 to 4 to fully utilize all of the column ADCs. Thus, in a 200 megapixel example, only 32768 bitlines are needed, or 2 bitlines per the pitch of the pixel cell (e.g., 0.61 um), which doesn't require extra metal layers.

Figure 8:
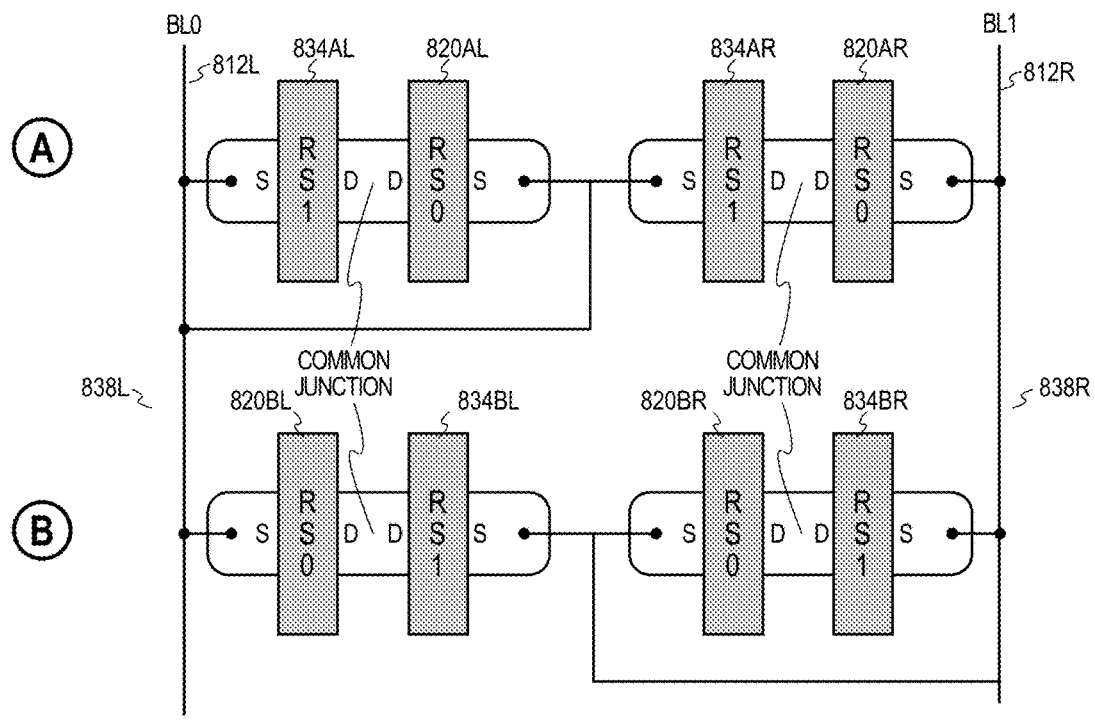
FIG. 8 shows an example horizontal layout of row select transistors included in shared pixel cells included in a pixel array in accordance with the teachings of the present invention.

As mentioned above, in one example, the first and second row select transistors of each shared pixel cell 704AL, 704AR, 704BL, 704BR share a drain region in a common junction. In other words, in the example, first and second row select transistors 720AL and 734AL, first and second row select transistors 720AR and 734AR, first and second row select transistors 720BL and 734BL, and first and second row select transistors 720BR and 734BR share drain regions in common junctions. To illustrate, FIG. 8 is a diagram that shows an example of a horizontal row select transistor arrangement that the shared drain regions of the first and second row select transistors of each shared pixel cell 704AL, 704AR, 704BL, 704BR included in a pixel array in accordance with the teachings of the present invention. Thus, it is appreciated that the row select transistors illustrated in FIG. 8 may be examples of the row select transistors illustrated in FIG. 7, and that the similarly named and numbered elements described above are coupled and function similarly below.

As shown in the example depicted in FIG. 8, the A-cell layout includes a first row select transistor 820AL disposed proximate to a second row select transistor 834AL. The A-cell also includes a first row select transistor 820AR disposed proximate to a second row select transistor 834AR. As discussed above, the drain regions of first row select transistors 820AL/820AR and second row select transistors 834AL/834AR are coupled to respective source regions of respective source follower transistors of the pixel cell. In the example, if it is assumed that the column bitlines (e.g., BL0 812L, BL1 812R) are aligned along a vertical axis, it is noted that first and second row select transistors 820AL and 834AL and that first and second row select transistors 820AR and 834AR are horizontally arranged relative to the column bitlines (e.g., perpendicular to the column bitlines), such that the respective drain regions of the row select transistors are adjacent to or overlapping with one another in the semiconductor material. In one example, these adjacent drain regions are shared regions included in a common junction and are therefore directly coupled together by sharing the drain with the silicon junction in common with split source junction regions of the respective source followers of the pixel cell. By sharing the common drain in the semiconductor (e.g., silicon) junction, no metal interconnection and no isolation structure are required. In another example, these adjacent drain regions may be coupled together via a short metal line. In either example, it is appreciated that this horizontal arrangement minimizes capacitance. As shown in the example A-cell, the source region of first row select transistor 820AR is coupled to bitline BL1 812R, while the source regions of first row select transistor 820AL, second row select transistor 834AL, and second row select transistor 834AR are coupled to bitline BL0 812L.

Similarly, the B-cell layout includes a first row select transistor 820BL disposed proximate to a second row select transistor 834BL. As mentioned, in various examples, the pixel cells alternate in a repeating pattern between A-cell and B-cell layouts for each consecutive row in a column as shown. The B-cell also includes a first row select transistor 820BR disposed proximate to a second row select transistor 834BR. In the example, it is noted that first and second row select transistors 820BL and 834BL and that first and second row select transistors 820BR and 834BR are horizontally arranged such that their respective drain regions are adjacent to or overlapping with one another in the semiconductor material. Similar to the A-cell, these adjacent drain regions in the B-cell are also shared regions included in a common junction and are therefore directly coupled together by sharing the drain with the silicon junction in common with split source junction regions of the respective source followers of the pixel cell. By sharing the common drain in the semiconductor (e.g., silicon) junction, no metal interconnection and no isolation structure are required. In another example, these adjacent drain regions are coupled together via a short metal line. In either example, it is appreciated that this horizontal arrangement minimizes capacitance. As shown in the example B-cell, the source region of first row select transistor 820BL is coupled to bitline BL0 812L, while the source regions of first row select transistor 820BR, second row select transistor 834BL, and second row select transistor 834BR are coupled to bitline BL1 812R.

As can be appreciated, the layout illustrated in FIG. 8 is designed that there is no significant difference in the semiconductor patterning between the A-cells and the B-cells. The differences between the A-cells and the B-cells are that the relative physical locations of the pairs of first and second row select transistors 820AL/834AL, 820AR/834AR, 820BL/834BL, 820BR/834BR, are switched horizontally relative to one another from left-to-right or from right-to-left as shown. As can be observed in the depicted example, the second row select transistors 834AL, 834AR, 834BL, 834BR are disposed or physically located in the semiconductor material closer to the column bitline BL0 812L or column BL1 812R that they are coupled to when compared to the corresponding first row select transistors 820AL, 820AR, 820BL, 820BR of same shared pixel cell.

To illustrate, the example depicted in FIG. 8 shows that for the A-cells in the top row, the second row select transistors 834AL, 834AR that are responsive to the second row select signal RS1 are both coupled to the first column bitline BL0 812L on the left side 838L of the illustrated arrangement. Thus, the second row select transistors 834AL, 834AR are disposed or physically located in the semiconductor material closer to the first column bitline BL0 812L when compared to the corresponding first row select transistors 820AL, 820AR. Similarly, in the B-cells in the next row, the second row select transistors 834BL, 834BR that are responsive to the second row select signal RS1 are both coupled to the second column bitline BL1 812R on the right side 838R of the illustrated arrangement. Thus, the second row select transistors 834BL, 834BR are disposed or physically located in the semiconductor material closer to the second column bitline BL1 812R on the right side 838R when compared to the corresponding first row select transistors 820AL, 820AR. As mentioned, in the various examples, this alternating layout pattern repeats for down the rows for each column in accordance with the teachings of the present invention.

It is further appreciated that the physical locations of the first column bitline BL0 812L and the second column bitline BL1 812R are the same for the A-cells in the top row and the B-cells in the next row. As such, only the metal connections and vias differ only slightly between the A-cells in the top row and the B-cells in the next row in the depicted layout in order to couple the row select transistors to the column bitlines. As such, the bitline metal capacitance is minimized in this layout example in accordance with the teachings of the present invention.

Figure 9:
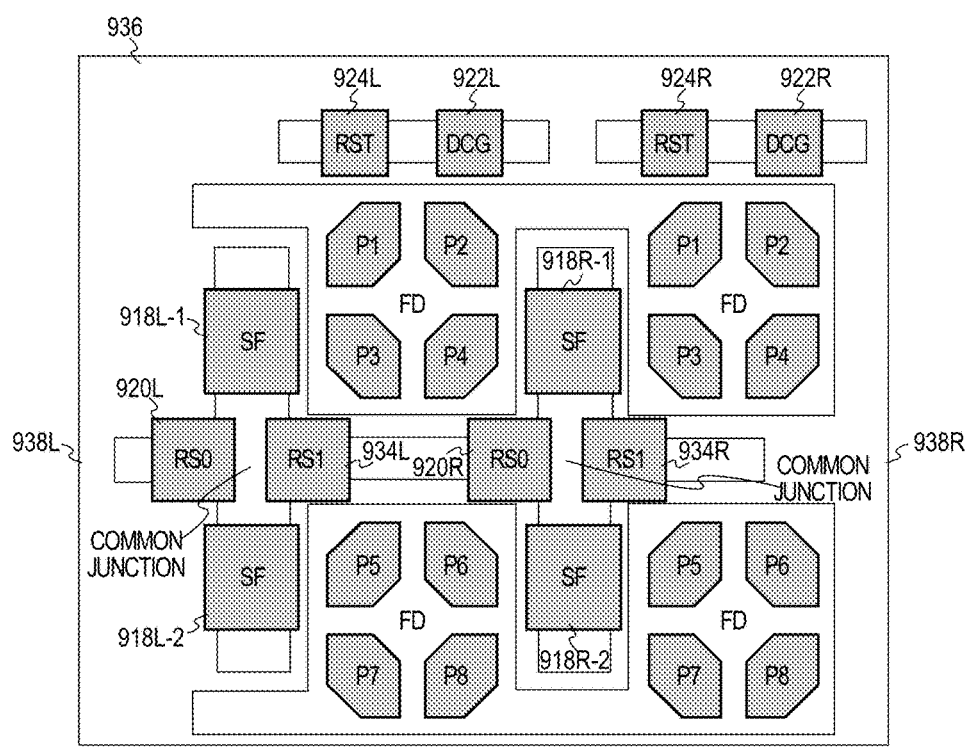
FIG. 9 shows a top view of an example layout of an arrangement of shared pixel cells including a left 2×4 shared pixel cell and a right shared pixel cell included in a pixel array with binning implemented with dual row select transistors in accordance with the teachings of the present invention.

FIG. 9 shows generally a top view of an example layout an arrangement of shared pixel cells including a left 2×4 shared pixel cell and a right shared pixel cell included in a pixel array with binning implemented with dual row select transistors in accordance with the teachings of the present invention. It is appreciated that the 16C arrangement of shared pixel cells illustrated in FIG. 9 may be an example of one of the 16C arrangements of shared pixel cells discussed above, and the similarly named and numbered elements described above are coupled and function similarly below. It is also noted that the example depicted in FIG. 9 describes 2×4 arrangements of photodiodes for explanation purposes, but that in other examples, different arrangements of photodiodes, such as 2×2 arrangements of photodiodes, etc., may be included in the shared pixel cells in accordance with the teachings of the present invention.

As shown in the example depicted in FIG. 9, the left shared pixel cell includes the photodiodes P1-P8 disposed in semiconductor material 936 (e.g., silicon), which are coupled to generate image charge in response to incident light. In the example, the photodiodes P1-P8 are coupled to transfer their photogenerated image charge to a floating diffusion FD, which is coupled to dual source followers 918L-1/918L-2. In the specific example depicted in FIG. 9, it is noted that there is a floating diffusion FD disposed in semiconductor material 936 in a central location relative to photodiodes P1-P4 and a floating diffusion FD disposed in semiconductor material 936 in a central location relative to photodiodes P5-P8. In the example, these floating diffusions FD may be coupled together and to the gate terminals of the two source followers 918L-1/918L-2 with a metal line in a metal layer that is out of view in the illustration. In the example, the dual source follower transistors 918L-1/918L-2 are implemented with the common junction sharing design technique by sharing source regions of the two source followers 918L-1/918L-2, as illustrated with the common junction including the shared region between the gates of the source follower transistors 918L-1/918L-2. The reset transistor 924L is coupled to reset the pixel cell, and the dual conversion gain transistor 922L is coupled to enable an LCG mode when turned on and an HCG mode when turned off. It is appreciated that the corresponding photodiodes P1-P8, floating diffusions FD, dual source followers 918R-1/918R-2, reset transistor 924R, and dual conversion gain transistor 922R of the right shared pixel cell are coupled and function similarly as their left shared pixel cell counterparts.

Similar to the example described above in FIG. 8, the 16C arrangement of left and right shared pixel cells also includes a first row select transistor 920L disposed proximate to a second row select transistor 934L. In addition, a first row select transistor 920R is disposed proximate to a second row select transistor 934R. As shown in the example, the first and second row select transistors 920L and 934L and the first and second row select transistors 920R and 934R are horizontally arranged such that their respective drain regions are adjacent to or overlapping with one another in the semiconductor material 936. In one example, these adjacent drain regions are shared regions and are therefore coupled together by sharing the drain with the silicon junction in common with split source junction regions of the respective source followers 918L-1/918L-2, 918R-1/918R-2. By sharing the common drain in the semiconductor (e.g., silicon) junction, no metal interconnection and no isolation structure are required. As such, with the common junction sharing design technique utilized in one example for the dual source followers 918L-1/918L-2, a split source junction region of the dual source followers 918L-1/918L-2 into the shared drain region of the two row select transistors 920L, 934L in the common junction provide improved direct coupling through the semiconductor material (e.g., silicon) with no additional metal and no isolation required. However, in another example, it is appreciated that these adjacent regions may be coupled together via a short metal line. In either example, it is appreciated that this horizontal adjacent drain arrangement illustrated in the example of FIG. 9 minimizes capacitance.

Similarly, the drain regions of first row select transistor 920R and second row select transistor 934R are coupled to the source regions of dual source followers 918R-1/918R-2. As mentioned, in one example, the dual source followers 918R-1/918R-2 are also implemented with the common junction sharing, as also illustrated with the shared regions between the gates of the source follower transistors 918R-1/918R-2. Thus, in the example, there is a common shared junction region between the gates of the dual source followers and between the gates of the two row select transistors of each shared pixel cell in accordance with the teachings of the present invention. In one example, the source region of first row select transistor 920L is coupled to bitline BL0 (not shown), while the source regions of first row select transistor 920R, second row select transistor 934L, and second row select transistor 934R are coupled to bitline BL1 (not shown).

In one example, it is appreciated that the layout pattern of the 16C arrangement of left and right shared pixel cells illustrated in FIG. 9 can substantially replicated or for repeated for a layout of 16C arrangement in a neighboring row, with the exception of switching or alternating the relative horizontal positions of the first and second row select transistors 920L/934L and 920R/934R, as discussed above in FIG. 8. As such, only the metal connections and vias differ slightly, and the bitline metal capacitance is minimized in this layout style.

Therefore, assuming that the layout illustrated in FIG. 9 is an example of a B-cell as discussed above for instance in FIGS. 7-8, it is noted that an example layout of an A-cell compared to the example layout shown in FIG. 9 is also designed so that there is no significant difference in the semiconductor patterning between the A-cells and the B-cells. Similar to the example described above in FIG. 8, the differences between the A-cells and the B-cells shown in FIG. 9 are that the relative physical locations of the pairs of first and second row select transistors 920AL/934AL, 920AR/934AR, are switched horizontally relative to one another from left-to-right or from right-to-left.

To illustrate, assuming that FIG. 9 shows an example layout of a B-cell, the depicted example the second row select transistors 934L, 934R that are responsive to the second row select signal RS1 are disposed or physically located in the semiconductor material closer 936 to the right side 938R of the illustrated arrangement, which is closer to the physical location of the column bitline that the second row select transistors 934L, 934R are coupled to, when compared to the corresponding first row select transistors 920L, 920R that are responsive to the first row select signal RS0. In an example layout of an A-cell, which would be in the next row, it is appreciated that the second row select transistors that are responsive to the second row select signal RS1 are disposed or physically located in the semiconductor material 936 closer to the left side 938L of the illustrated arrangement when compared to the corresponding first row select transistors that are responsive to the first row select signal RS0. Similar to the example described in FIG. 8 above, it is also appreciated that the physical locations of the first column bitline BL0 the second column bitline BL1 are the same for the A-cells and the B-cells in the next row for the example depicted in FIG. 9. As such, only the metal connections and vias differ slightly between the A-cells of one row and the B-cells of a next row in the depicted layout in order to couple the row select transistors to the column bitlines. As such, the bitline metal capacitance is minimized in this layout example in accordance with the teachings of the present invention.

Figure 10:
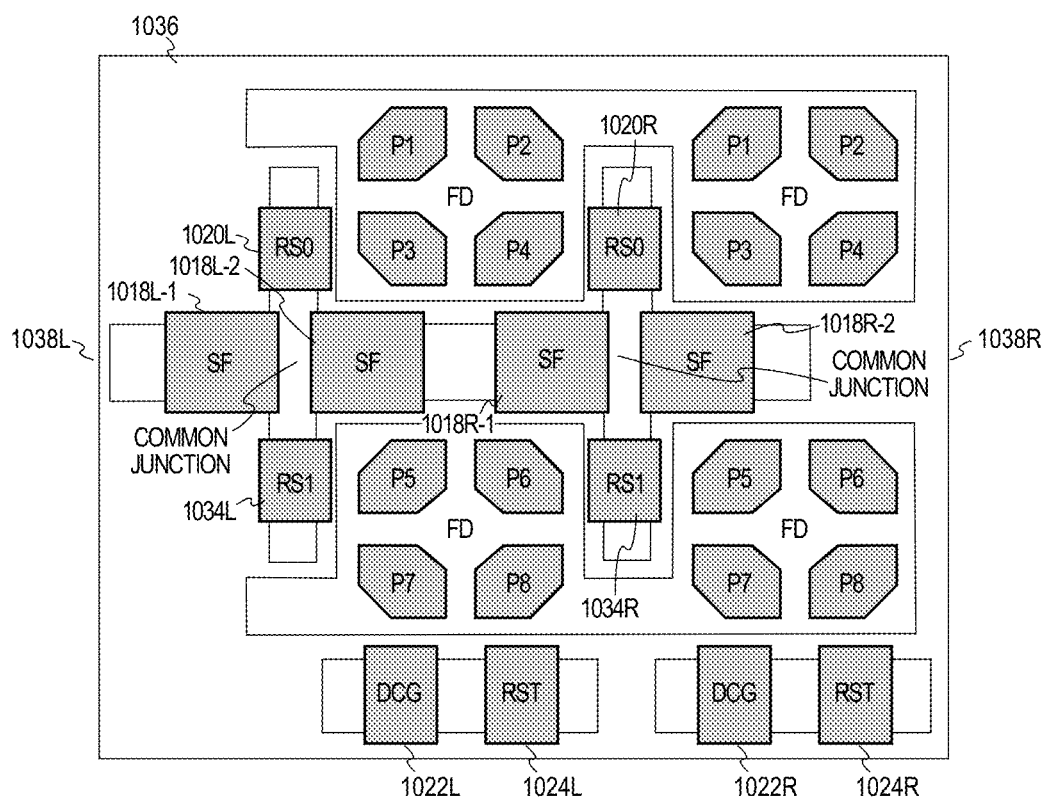
FIG. 10 shows a top view of another example layout of an arrangement of shared pixel cells including a left 2×4 shared pixel cell and a right shared pixel cell included in a pixel array with binning implemented with dual row select transistors in accordance with the teachings of the present invention.

FIG. 10 shows generally a top view of another example layout an arrangement of shared pixel cells including a left 2×4 shared pixel cell and a right shared pixel cell included in a pixel array with binning implemented with dual row select transistors in accordance with the teachings of the present invention. It is appreciated that the 16C arrangement of shared pixel cells illustrated in FIG. 10 may be another example of one of the 16C arrangements of shared pixel cells discussed above, and the similarly named and numbered elements described above are coupled and function similarly below. It is also noted that the example depicted in FIG. 10 describes 2×4 arrangements of photodiodes for explanation purposes, but that in other examples, different arrangements of photodiodes, such as 2×2 arrangements of photodiodes, etc., may be included in the shared pixel cells in accordance with the teachings of the present invention.

It is also appreciated that the example layout illustrated in FIG. 10 shares many similarities with the example layout illustrated in FIG. 9. For instance, as shown in the example depicted in FIG. 10, the left shared pixel cell includes the photodiodes P1-P8 disposed in semiconductor material 1036 (e.g., silicon), which are coupled to generate image charge in response to incident light. In the example, the photodiodes P1-P8 are coupled to transfer their photogenerated image charge to a floating diffusion FD, which is coupled to dual source followers 1018L-1/1018L-2. In the specific example depicted in FIG. 10, it is noted that there is a floating diffusion FD disposed in semiconductor material 1036 in a central location relative to photodiodes P1-P4 and a floating diffusion FD disposed in semiconductor material 1036 in a central location relative to photodiodes P5-P8. In the example, these floating diffusions FD may be coupled together and to the gate terminals of the two source followers 1018L-1/1018L-2 with a metal line in a metal layer that is out of view in the illustration. In the depicted example, the dual source follower transistors 1018L-1/1018L-2 are implemented with the common junction sharing design technique by sharing source regions of the two source followers 1018L-1/1018L-2, as illustrated with the shared region between the gates of the source follower transistors 1018L-1/1018L-2. The reset transistor 1024L is coupled to reset the pixel cell, and the dual conversion gain transistor 1022L is coupled to enable an LCG mode when turned on and an HCG mode when turned off. It is appreciated that the corresponding photodiodes P1-P8, floating diffusions FD, dual source followers 1018R-1/1018R-2, reset transistor 1024R, and dual conversion gain transistor 1022R of the right shared pixel cell are coupled and function similarly as their left shared pixel cell counterparts.

One of the differences between the example layout illustrated in FIG. 10 and the example layout illustrated in FIG. 9 is that in the example illustrated in FIG. 10, the row select transistors are placed in a vertical arrangement instead of a horizontal arrangement. To illustrate, if it is assumed that the column bitlines are aligned along a vertical axis on the page (e.g., as also illustrated in previous examples described above), a first row select transistor 1020L is disposed proximate to a second row select transistor 1034L in a relative vertical location (on the page) parallel to the column bitlines. In addition, a first row select transistor 1020R is disposed proximate to a second row select transistor 1034R in a relative vertical location (on the page) parallel to the column bitlines. As such, each of the pair of first and second row select transistors 1020L/1034L has the same lateral distance to the left side 1038L and/or right side 1038R of the illustrated arrangement. Similarly, each of the pair of first and second row select transistors 1020R/1034R is the same lateral distance to the left side 1038L and/or right side 1038R of the illustrated arrangement. Thus, as shown in the example, the first and second row select transistors 1020L and 1034L and the first and second row select transistors 1020R and 1034R are vertically arranged (e.g., parallel to the column bitlines). Further, with the depicted layout, the respective drain regions of the pairs of rows select transistors 1020L/1034L, 1020R/1034R are also adjacent to or overlapping with one another in the semiconductor material 1036. In one example, these adjacent drain regions are shared regions and are therefore coupled together by sharing the drain with the silicon junction in common with split source junction regions of the respective source followers 1018L-1/1018L-2, 1018R-1/1918R-2. By sharing the common drain in the semiconductor (e.g., silicon) junction, no metal interconnection and no isolation structure are required. As such, with the common junction sharing design technique utilized in one example for the dual source followers 1018-L1/1018L-2, a split source junction region of the dual source followers 1018-L1/1018L-2 into the shared drain region of the two row select transistors 1020-L, 1034L in the common junction provide improved direct coupling through the semiconductor material (e.g., silicon) with no additional metal and no isolation required. However, in another example, it is appreciated that these adjacent regions may be coupled together via a short metal line. In either example, it is appreciated that this adjacent drain arrangement illustrated in the example of FIG. 10 also minimizes capacitance.

Similarly, the drain regions of first row select transistor 1020R and second row select transistor 1034R are coupled to the source regions of dual source followers 1018R-1/1018R-2. In one example, the dual source followers 1018R-1/1018R-2 are also implemented with the common junction sharing, as also illustrated with the shared regions between the gates of the source follower transistors 1018R-1/1018R-2. Thus, in the example, there is a common shared junction region between the gates of the dual source followers and between the gates of the two row select transistors of each shared pixel cell in accordance with the teachings of the present invention.

Figure 11:
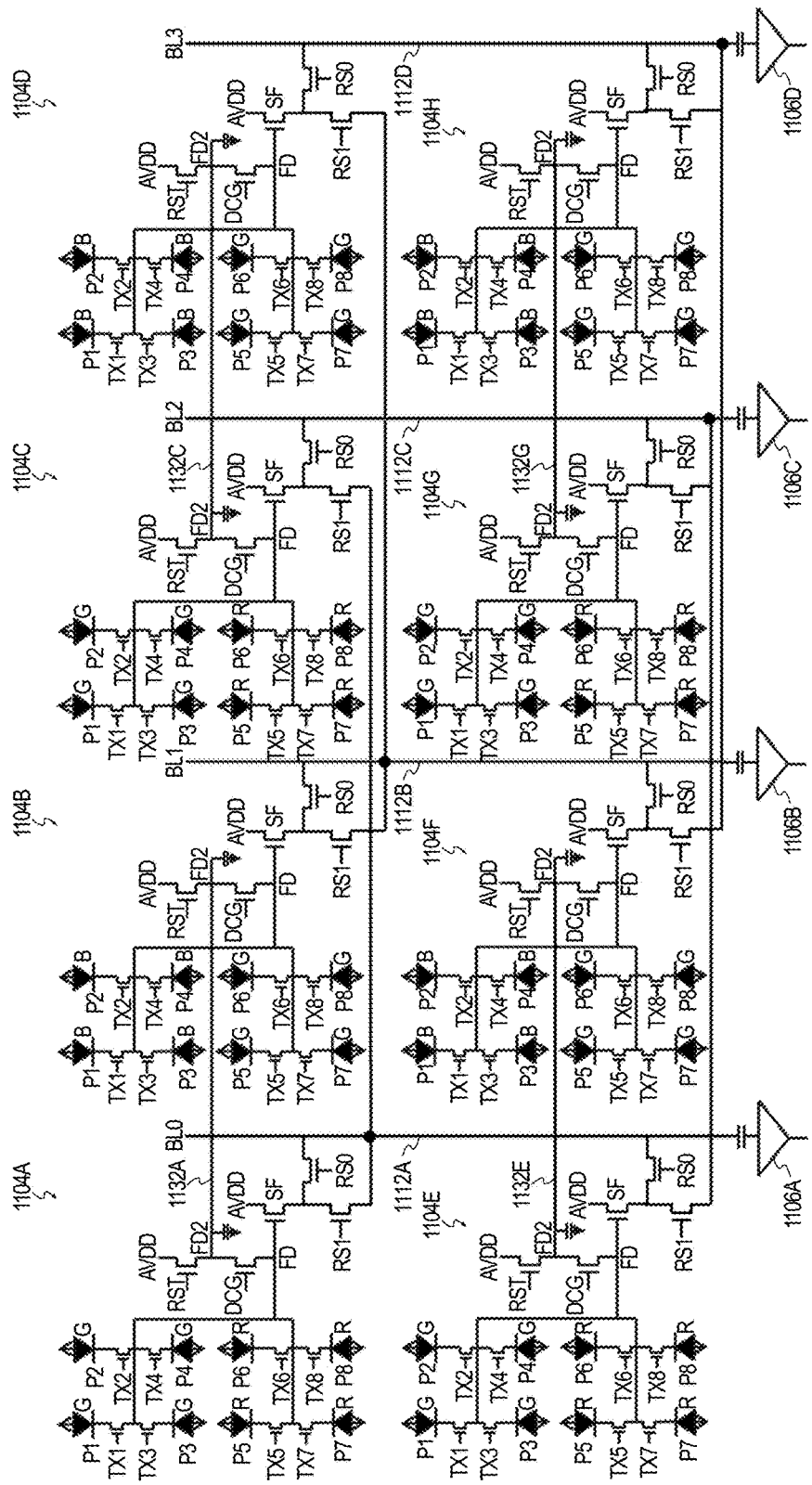
FIG. 11 shows yet another example illustrating an arrangement of several rows of shared pixel cells included in a pixel array with binning implemented with second row select transistors coupling source followers from pixel cells to a bitline of other pixel cells to provide binning in accordance with the teachings of the present invention.

FIG. 11 shows yet another example illustrating an arrangement of several rows of shared pixel cells included in a pixel array with binning implemented with second row select transistors coupling source followers from pixel cells to a bitline of other pixel cells in accordance with the teachings of the present invention. It is noted that the example depicted in FIG. 11 describes 2×4 arrangements of photodiodes for explanation purposes, but that in other examples, different arrangements of photodiodes, such as a 2×2 arrangements of photodiodes, etc., may be included in the shared pixel cells in accordance with the teachings of the present invention. It is also appreciated that the pixel cells illustrated in FIG. 11 share some similarities with pixel cell 204, which is described in detail above in connection with FIG. 2A, and that the similarly named and numbered elements described above are coupled and function similarly below. Further, it is appreciated therefore that the coupling and operation of shared pixel cells are not be described again in complete detail for the sake of brevity.

It is also appreciated that the example layout illustrated in FIG. 11 shares some similarities with the example layout illustrated in FIG. 7. For instance, FIG. 11 shows an arrangement of shared pixel cells, which include shared pixel cells 1104A, 1104B, 1104C, 1104D in a first row in FIG. 11, and shared pixel cells 1104E, 1104F, 1104G, 1104H in a second row. In the example, shared pixel cells 1104A and 1104E are coupled to bitline BL0 1112A, which is coupled to column ADC 1106A, shared pixel cells 1104B and 1104F are coupled to bitline BL1 1112B, which is coupled to column ADC 1106B, shared pixel cells 1104C and 1104G are coupled to bitline BL2 1112C, which is coupled to column ADC 1106C, and shared pixel cells 1104D and 1104H are coupled to bitline BL3 1112D, which is coupled to column ADC 1106D.

In the example depicted in FIG. 11, each shared pixel cell includes eight photodiodes P1-P8, which share a respective floating diffusion FD. In the example, photodiodes P5-P8 of shared pixel cells 1104A, 1104C, 1104E, 1104G are configured to detect red (R) light, photodiodes P1-P4 of shared pixel cells 1104A, 1104C, 1104E, 1104G and photodiodes P5-P8 of shared pixel cells 1104B, 1104D, 1104F, 1104H are configured to detect green (G) light, and photodiodes P1-P4 of shared pixel cells 1104B, 1104D, 1104F, 1104H are configured to detect blue (B) light.

It is appreciated that the arrangement of shared pixel cells 1104A, 1104B, 1104C, 1104D, 1104E, 1104F, 1104G, 1104H shown in FIG. 11 can be applied to 2×2 or 2×4 or other shared pixel structures. Although the depicted example illustrates dual conversion gain (DCG) pixel cells with the inclusion of dual conversion gain transistors and second floating diffusions FD2, the arrangement can also be applied single conversion gain (SCG) pixel cell configurations. It is also noted that the example depicted in FIG. 11 also includes metal interconnects 1132A, 1132C, 1132E, 1132G connecting two second floating diffusions FD2 between shared pixel cells, it is appreciated that the metal interconnects 1132A, 1132C, 1132E, 1132G are optional as discussed above and can be removed with binning that can also be provided with second row select transistors RS1 as discussed above.

It is noted that one difference between the arrangement illustrated in FIG. 11 and previously described arrangements is that there are intervening columns of pixel cells between columns of pixel cells that are coupled together through the second row select transistors. For instance, as shown in the example depicted in FIG. 11, a first column may include shared pixel cells 1104A and 1104E, which are coupled to column bitline BL0 1112A through respective first and second row select transistors. A second column may include shared pixel cells 1104C and 1104G, which are coupled to column bitline BL2 1112C through respective first row select transistors. The second column pixel cells includes second row select transistors that are also coupled to the column bitline BL0 1112A.

However, the example depicted in FIG. 11 also illustrates that there is a third column of pixel cells 1104B, 1104F coupled to column bitline BL1 1112B. As shown in the depicted example, the third column of pixel cells 1104B, 1104F and column bitline BL1 1112B are disposed between the first column of pixel cells 1104A, 1104E and the second column of pixel cells 1104C, 1104G. Similarly, the second column of pixel cells 1104C, 1104G and column bitline BL2 1112C are disposed between the third column of pixel cells 1104B, 1104G and a fourth column of pixel cells 1104D, 1104H, as shown.

With the metal interconnects 1132A, 1132C, 1132E, 1132G connecting two second floating diffusions FD2 as shown, LCG mode readouts are provided with true FD binning of the 16 photodiodes of the two connected shared pixel cells, while HCG mode readouts are provided with bitline binning through two source followers, with each source follower coupled to generate the FD binning signal of the 8 photo diodes from same 2×4 shared pixel. In LCG mode readouts, it is appreciated that the effective source follower size is doubled, which results in faster bitline settling time when compared to single source follower configurations. Without the metal interconnects 1132A, 1132C, 1132E, 1132G connecting two second floating diffusions FD2, both HCG and LCG mode readouts may still be binned through the two source followers via the respective second row select RS1 transistors.

The arrangement of shared pixel cells shown in FIG. 11 can also be applied when horizontal binning (for 4Cs of the same color, for instance) is required. An example of the 4C color pattern arrangement is illustrated in FIG. 11 with the 2×2 groupings of red (R), green (G), and blue (B) color filters over the photodiodes as shown.

Figure 12:
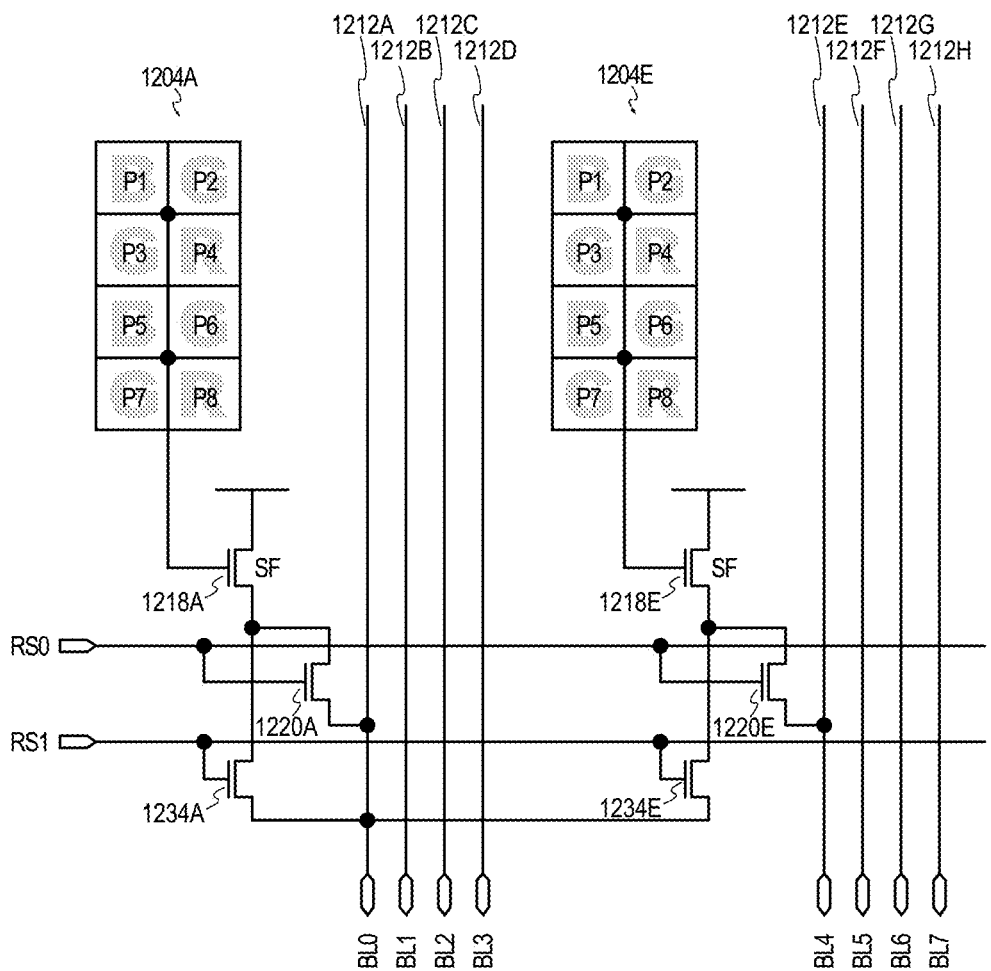
FIG. 12 shows another example illustrating an arrangement of shared pixel cells included in a pixel array with binning implemented with second row select transistors coupling the shared pixel cells to bitlines of other pixel cells in accordance with the teachings of the present invention.

FIG. 12 shows another example illustrating an arrangement of shared pixel cells included in a pixel array with binning implemented with second row select transistors coupling the shared pixel cells to bitlines of other pixel cells in accordance with the teachings of the present invention. It is appreciated that the shared pixel cells illustrated in FIG. 12 share similarities with the example shared pixel cells discussed above, and that the similarly named and numbered elements described above are coupled and function similarly below. Further, it is appreciated therefore that the coupling and operation of shared pixel cells are not be described again in complete detail for the sake of brevity. It is also noted that the example depicted in FIG. 12 describes 2×4 arrangements of photodiodes for explanation purposes, but that in other examples, different arrangements of photodiodes, such as 2×2 arrangements of photodiodes, etc., may be included in the shared pixel cells in accordance with the teachings of the present invention.

As shown, the example arrangement depicted in FIG. 12 illustrates that the dual row select transistor configurations in accordance with the teachings of the present invention may also be applied to RGB Bayer pattern color filter arrangements for full resolution as well as binning (e.g., 2×2, 2×4, etc.) modes. As shown in the example, a shared pixel cell 1204A coupled to a bitline BL0 1212A and a shared pixel cell 1204E coupled to a bitline BL4 1212E. Each shared pixel cell 1204A, 1204E illustrated in FIG. 12 includes photodiodes P1-P8, which are coupled to floating diffusions that are coupled to respective source follower transistors 1218A, 1218E, as shown. In the depicted example, shared pixel cell 1204A includes a first row select transistor 1220A coupled between the source region of source follower transistor 1218A and bitline BL0 1212A. Shared pixel cell 1204A also includes a second row select transistor 1234A coupled between the source region of source follower transistor 1218A and bitline BL0 1212A. As mentioned in previous examples, the drain regions of the dual row select transistors 1220A, 1234A may be shared in one example, or may be coupled together through a short metal connection in another example. Continuing with the example depicted in FIG. 12, shared pixel cell 1204E includes a first row select transistor 1220E coupled between the source region of source follower transistor 1218E and bitline BL4 1212E. Shared pixel cell 1204E also includes a second row select transistor 1234E coupled between the source region of source follower transistor 1218E and bitline BL4 1212E. As mentioned in previous examples, the drain regions of the dual row select transistors 1220B, 1234B may be shared in one example, or may be coupled together through a short metal connection in another example.

The example arrangement depicted in FIG. 12 has the flexibility to be operated in a variety of modes. For example, with the second row select transistors 1234A, 1234B turned off in response to row select signal RS1, the first row select transistors 1220A, 1220E can be turned on to readout individual photodiodes, such for instance the blue (B) photodiode P1 of shared pixel cells 1204A, 1204E, through bitline BL0 1212A and through bitline BL4 1212E, respectively, for a full resolution mode (1C) readout.

In another example, with the first row select transistors 1220A, 1220B turned off in response to row select signal RS0, the second row select transistors 1234A, 1234E can be turned on in response to row select signal RS1 to readout binned photodiodes, such for instance the blue (B) photodiode P1 binned with the blue (B) photodiode P5 of shared pixel cells 1204A, 1204E, through bitline BL0 1212A for a 2×2 binning mode (4C) readout. In this example, the blue (B) photodiodes P1 and P5 image signals are charge binned at the floating diffusion from each shared pixel cell 1204A, 1204E, and the signals are then averaged through the outputs of source follower transistors 1218A, 1218E, which is then read out through it bitline BL0 1212A for a 4C binned readout.

It is appreciated of course the readouts of the blue (B) photodiodes P1, P5 are described above for explanation purposes and that the red (R) photodiodes P4, P8 and/or green (G) photodiodes P2, P6 or P3, P7 can be read out similarly.

Figure 13:
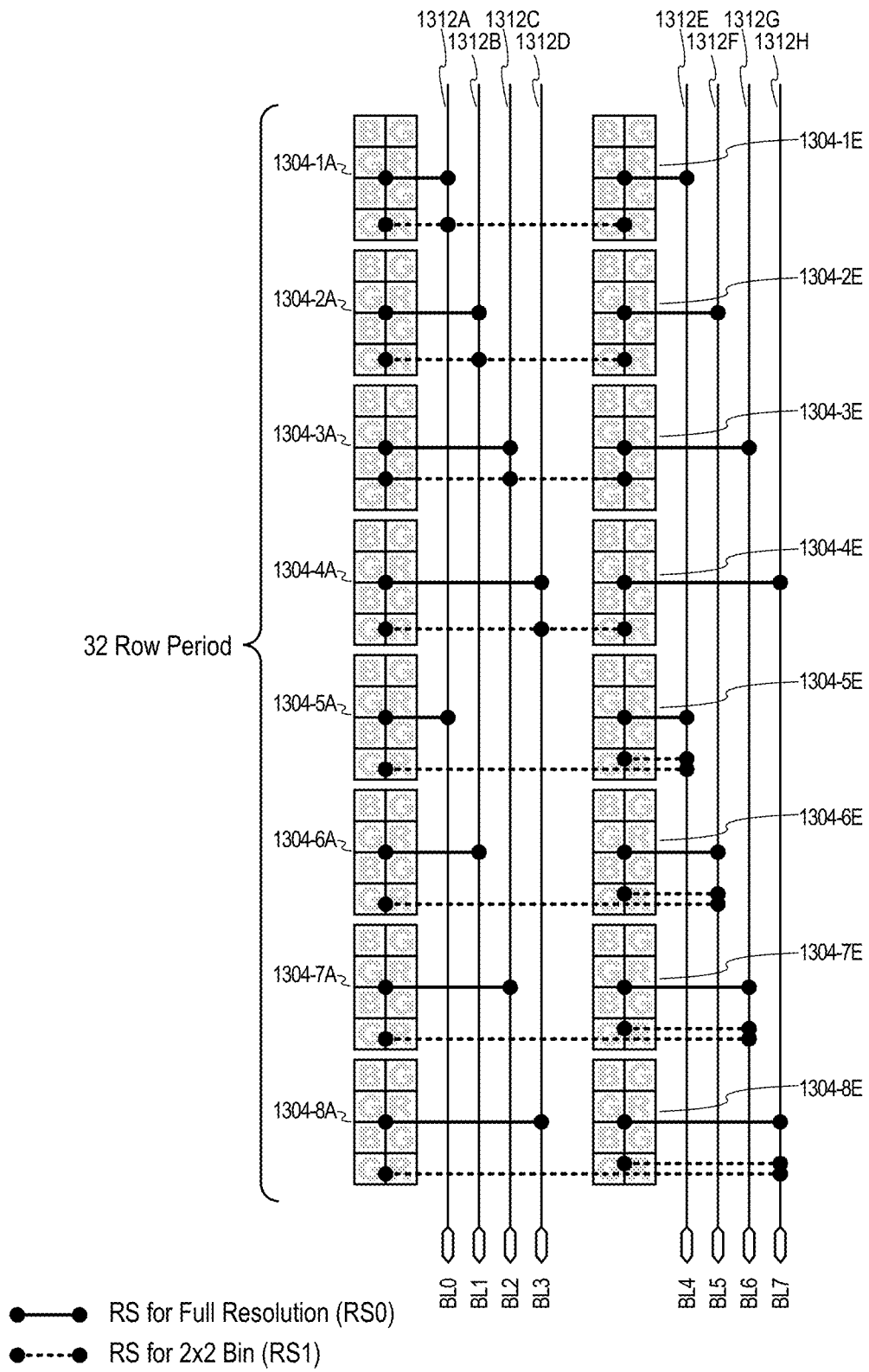
FIG. 13 shows still another example illustrating an arrangement of shared pixel cells included in a pixel array with binning implemented with second row select transistors coupling the shared pixel cells to bitlines of other pixel cells in accordance with the teachings of the present invention.

FIG. 13 shows still another example illustrating an arrangement of shared pixel cells included in a pixel array with binning implemented with second row select transistors coupling the shared pixel cells to bitlines of other pixel cells to provide binning without crosstalk in accordance with the teachings of the present invention. It is appreciated that the shared pixel cell arrangement as illustrated in FIG. 13 share many similarities with the example shared pixel cell arrangement as illustrated in FIG. 12 discussed above, and that the similarly named and numbered elements described above are coupled and function similarly below. Further, it is appreciated therefore that the coupling and operation of shared pixel cells are not be described again in complete detail for the sake of brevity. It is also noted that the example depicted in FIG. 13 describes 2×4 arrangements of photodiodes for explanation purposes, but that in other examples, different arrangements of photodiodes, such as 2×2 arrangements of photodiodes, etc., may be included in the shared pixel cells in accordance with the teachings of the present invention.

As shown, the example arrangement depicted in FIG. 13 illustrates a 32 row period of shared pixel cells that are arranged similar to the dual row select transistor RGB pattern color filter arrangement illustrated in FIG. 12. In the example, the row select signal RS0 is configured to turn on the first row select transistors for a full resolution (1C) readout while the row select signal RS1 is configured to turn off the second row select transistor. These examples are depicted in FIG. 13 with the solid line coupled between the bitlines and the shared pixel cells.

In the example, the row select signal RS1 is configured to turn on the second row select transistors for a 2×2 binning mode (4C) readout while the row select signal RS0 is configured to turn off the first row select transistor. These examples are depicted in FIG. 13 with the dashed-line coupled between the bitlines and the shared pixel cells.

As shown, shared pixel cell 1304-1A is coupled to bitline BL0 1312A and shared pixel cell 1304-1E is coupled to bitline BL4 1312E in response to row select signal RS0 for full resolution (1C) readout mode. Shared pixel cell 1304-1A and shared pixel cell 1304-1E are both coupled to bitline BL0 1312A in response to row select signal RS1 for 2×2 binning (4C) readout mode.

Shared pixel cell 1304-2A is coupled to bitline BL1 1312B and shared pixel cell 1304-2E is coupled to bitline BL5 1312F in response to row select signal RS0 for full resolution (1C) readout mode. Shared pixel cell 1304-2A and shared pixel cell 1304-2E are both coupled to bitline BL1 1312B in response to row select signal RS1 for 2×2 binning (4C) readout mode.

Shared pixel cell 1304-3A is coupled to bitline BL2 1312C and shared pixel cell 1304-3E is coupled to bitline BL6 1312G in response to row select signal RS0 for full resolution (1C) readout mode. Shared pixel cell 1304-3A and shared pixel cell 1304-3E are both coupled to bitline BL2 1312C in response to row select signal RS1 for 2×2 binning (4C) readout mode.

Shared pixel cell 1304-4A is coupled to bitline BL3 1312D and shared pixel cell 1304-4E is coupled to bitline BL7 1312H in response to row select signal RS0 for full resolution (1C) readout mode. Shared pixel cell 1304-4A and shared pixel cell 1304-4E are both coupled to bitline BL3 1312D in response to row select signal RS1 for 2×2 binning (4C) readout mode.

Shared pixel cell 1304-5A is coupled to bitline BL0 1312A and shared pixel cell 1304-5E is coupled to bitline BL4 1312E in response to row select signal RS0 for full resolution (1C) readout mode. Shared pixel cell 1304-5A and shared pixel cell 1304-5E are both coupled to bitline BL4 1312E in response to row select signal RS1 for 2×2 binning (4C) readout mode.

Shared pixel cell 1304-6A is coupled to bitline BL1 1312B and shared pixel cell 1304-6E is coupled to bitline BL5 1312F in response to row select signal RS0 for full resolution (1C) readout mode. Shared pixel cell 1304-6A and shared pixel cell 1304-6E are both coupled to bitline BL5 1312F in response to row select signal RS1 for 2×2 binning (4C) readout mode.

Shared pixel cell 1304-7A is coupled to bitline BL2 1312C and shared pixel cell 1304-7E is coupled to bitline BL6 1312G in response to row select signal RS0 for full resolution (1C) readout mode. Shared pixel cell 1304-7A and shared pixel cell 1304-7E are both coupled to bitline BL6 1312G in response to row select signal RS1 for 2×2 binning (4C) readout mode.

Shared pixel cell 1304-8A is coupled to bitline BL3 1312D and shared pixel cell 1304-8E is coupled to bitline BL7 1312H in response to row select signal RS0 for full resolution (1C) readout mode. Shared pixel cell 1304-8A and shared pixel cell 1304-8E are both coupled to bitline BL7 1312H in response to row select signal RS1 for 2×2 binning (4C) readout mode.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel array, comprising:
    a plurality of pixel cells disposed in a semiconductor material, wherein each of the pixel cells of the plurality of pixel cells includes:
        a plurality of photodiodes to generate image charge in response to incident light;
        a first floating diffusion coupled to receive the image charge generated by the plurality of photodiodes;
        a first source follower transistor having a gate coupled to the first floating diffusion to generate a respective image signal at a source region of the first source follower transistor in response to the image charge in the first floating diffusion; and
        a first row select transistor having a drain region coupled to the source region of the first source follower;
        a second row select transistor having a drain region coupled to the source region of the first source follower; and
        a common junction disposed in the semiconductor material between a gate of the first row select transistor and a gate of the second row select transistor, wherein the drain region of the first row select transistor and the drain region of the second row select transistor are shared and coupled together through the semiconductor material of the common junction; and
    a plurality of column bitlines coupled to the plurality of pixel cells, wherein the plurality of pixel cells are organized into a plurality of columns of pixel cells and a plurality of rows of pixel cells, wherein each one of the plurality of column bitlines corresponds to a respective one of the plurality of columns of pixel cells.

2. The pixel array of claim 1, wherein the source region of the first source follower transistor comprises a split source junction region included in the semiconductor material of the common junction such that the split source junction region of the first source follower transistor, the drain region of the first row select transistor, and the drain region of the second row select transistor are shared and coupled together through the semiconductor material of the common junction.

3. The pixel array of claim 2, wherein each of the pixel cells of the plurality of pixel cells further includes a second source follower transistor having a gate coupled to the first floating diffusion to generate the respective image signal at a source region of the second source follower transistor in response to the image charge in the first floating diffusion, wherein the source region of the second source follower transistor is coupled to the drain region of the first row select transistor and the drain region of the second row select transistor.

4. The pixel array of claim 3, wherein the source region of the second source follower transistor comprises a split source junction region included in the semiconductor material of the common junction such that the split source junction region of the second source follower transistor, the split source junction region of the first source follower transistor, the drain region of the first row select transistor, and the drain region of the second row select transistor are shared and coupled together through the semiconductor material of the common junction.

5. The pixel array of claim 1, wherein the plurality of column bitlines includes a first column bitline and a second column bitline, wherein the plurality of columns of pixel cells includes a first column of pixel cells and a second column of pixel cells, wherein the first column bitline corresponds to the first column of pixel cells, and wherein the second column bitline corresponds to the second column of pixel cells.

6. The pixel array of claim 5, wherein a source region of the first row select transistor of each pixel cell of the first column of pixel cells is coupled to the first column bitline.

7. The pixel array of claim 6, wherein the first column of pixel cells includes a first subgroup of pixel cells and a second subgroup of pixel cells, wherein the first subgroup of pixel cells includes every other row of pixel cells of the first column of pixel cells and the second subgroup of pixel cells includes every other row of pixel cells of the first column of pixel cells not included in the first subgroup of pixel cells.

8. The pixel array of claim 7,
    wherein a source region of the second row select transistor of each pixel cell of the first subgroup of pixel cells is coupled to the first column bitline to bin the respective image signal at the source region of the first source follower transistor with a respective image signal generated by a pixel cell of another column of pixel cells that is coupled to the first column bitline when the second row select transistor is turned on,
    wherein a source region of the second row select transistor of each pixel cell of the second subgroup of pixel cells is coupled to the second column bitline to bin the respective image signal at the source region of the first source follower transistor with a respective image signal generated by a pixel cell of another column that is coupled to the second column bitline when the second row select transistor is turned on.

9. The pixel array of claim 8, wherein the second row select transistor of each pixel cell of the first subgroup of pixel cells is disposed in the semiconductor material closer to the first column bitline than the first row select transistor, and wherein the second row select transistor of each pixel cell of the second subgroup of pixel cells is disposed in the semiconductor material closer to the second column bitline than the first row select transistor.

10. The pixel array of claim 8, wherein an arrangement of the first row select transistor relative to the second row select transistor in the semiconductor material is perpendicular relative to an alignment of the first and second column bitlines.

11. The pixel array of claim 8, wherein an arrangement of the first row select transistor relative to the second row select transistor in the semiconductor material is parallel relative to an alignment of the first and second column bitlines.

12. The pixel array of claim 5, wherein the first column of pixel cells is a neighboring column of the second column of pixel cells.

13. The pixel array of claim 5, wherein the plurality of columns of pixel cells further includes a third column of pixel cells, wherein the third column of pixel cells is disposed between the first column of pixel cells and the second column of pixel cells.

14. The pixel array of claim 5, wherein each of the pixel cells of the plurality of pixel cells includes 8 photodiodes organized into a 2×4 arrangement.

15. The pixel array of claim 14, wherein the 2×4 arrangement of photodiodes of a first pixel cell of the first column of pixel cells and the 2×4 arrangement of photodiodes of a corresponding pixel cell of the second column of pixel cells are configured to detect light having a same color to provide a 16C binned image signal through the first row select transistor of said first pixel cell of the first column of pixel cells and the second row select transistor of said corresponding pixel cell of the second column of pixel cells to the first column bitline.

16. The pixel array of claim 14, wherein the 2×4 arrangement of photodiodes includes two 2×2 arrangements of photodiodes.

17. The pixel array of claim 16, wherein a first one of the 2×2 arrangements of photodiodes is configured to detect a first color of the incident light and wherein a second one of the 2×2 arrangements is configured to detect a second color of the incident light, wherein the first and second colors of are two of three colors included in a group of colors including red, green, and blue.

18. The pixel array of claim 17, wherein a first image signal is read out through the first column bitline through the first row select transistor of a first pixel cell of the first column of pixel cells and a second image signal is read out through the second column bitline through the first row select transistor of a first pixel cell of the second column of pixel cells for a full resolution 1C readout or for a 4C binned readout from the pixel array.

19. The pixel array of claim 16, wherein each of a first and a second one of the 2×2 arrangements of photodiodes includes first, second, third, and fourth photodiodes configured to detect red (R) light, green (G) green light, green (G) light, and blue (B) light, respectively, through a color filter array having a Bayer color filter pattern.

20. The pixel array of claim 19, wherein a first image signal is read out through the first column bitline through the first row select transistor of a first pixel cell of the first column of pixel cells and a second image signal is read out through the second column bitline through the first row select transistor of a first pixel cell of the second column of pixel cells for a full resolution 1C readout from the pixel array.

21. The pixel array of claim 20, wherein an image signal is read out through the first column bitline through the first row select transistor of a first pixel cell of the first column of pixel cells and the second row select transistor of a first pixel cell of the second column of pixel cells for a binned 2×2 4C readout from the pixel array.

22. The pixel array of claim 1, wherein each of the pixel cells of the plurality of pixel cells further comprises:
a second floating diffusion; and
a dual conversion gain (DCG) transistor coupled between the first floating diffusion and the second floating diffusion, wherein said each of the pixel cells of the plurality of pixel cells is configured to be in high conversion gain (HCG) mode when the DCG transistor is turned off, and wherein said each of the plurality of pixel cells is configured to be in low conversion gain (LCG) mode when the DCG transistor is turned on.

23. The pixel array of claim 1, wherein each of the pixel cells of the plurality of pixel cells further comprises a reset transistor coupled between a voltage supply and the first floating diffusion.

24. An imaging system, comprising:
a pixel array, including:
a plurality of pixel cells disposed in a semiconductor material, wherein each of the pixel cells of the plurality of pixel cells includes:
a plurality of photodiodes to generate image charge in response to incident light;
a first floating diffusion coupled to receive the image charge generated by the plurality of photodiodes;
a first source follower transistor having a gate coupled to the first floating diffusion to generate a respective image signal at a source region of the first source follower transistor in response to the image charge in the first floating diffusion; and
a first row select transistor having a drain region coupled to the source region of the first source follower;
a second row select transistor having a drain region coupled to the source region of the first source follower; and
a common junction disposed in the semiconductor material between a gate of the first row select transistor and a gate of the second row select transistor, wherein the drain region of the first row select transistor and the drain region of the second row select transistor are shared and coupled together through the semiconductor material of the common junction; and
a plurality of column bitlines coupled to the plurality of pixel cells, wherein the plurality of pixel cells are organized into a plurality of columns of pixel cells and a plurality of rows of pixel cells, wherein each one of the plurality of column bitlines corresponds to a respective one of the plurality of columns of pixel cells;
control circuitry coupled to the pixel array to control operation of the pixel array; and
readout circuitry coupled to the pixel array to readout image data from the pixel array.

25. The imaging system of claim 24, further comprising function logic coupled to the readout circuitry to store the image data readout from the pixel array.

26. The imaging system of claim 24, wherein the source region of the first source follower transistor comprises a split source junction region included in the semiconductor material of the common junction such that the split source junction region of the first source follower transistor, the drain region of the first row select transistor, and the drain region of the second row select transistor are shared and coupled together through the semiconductor material of the common junction.

27. The imaging system of claim 24, wherein each of the pixel cells of the plurality of pixel cells further includes a second source follower transistor having a gate coupled to the first floating diffusion to generate the respective image signal at a source region of the second source follower transistor in response to the image charge in the first floating diffusion, wherein the source region of the second source follower transistor is coupled to the drain region of the first row select transistor and the drain region of the second row select transistor.

28. The imaging system of claim 27, wherein the source region of the second source follower transistor comprises a split source junction region included in the semiconductor material of the common junction such that the split source junction region of the second source follower transistor, the split source junction region of the first source follower transistor, the drain region of the first row select transistor, and the drain region of the second row select transistor are shared and coupled together through the semiconductor material of the common junction.

29. The imaging system of claim 24, wherein the plurality of column bitlines includes a first column bitline and a second column bitline, wherein the plurality of columns of pixel cells includes a first column of pixel cells and a second column of pixel cells, wherein the first column bitline corresponds to the first column of pixel cells, and wherein the second column bitline corresponds to the second column of pixel cells.

30. The imaging system of claim 29, wherein a source region of the first row select transistor of each pixel cell of the first column of pixel cells is coupled to the first column bitline.

31. The imaging system of claim 30, wherein the first column of pixel cells includes a first subgroup of pixel cells and a second subgroup of pixel cells, wherein the first subgroup of pixel cells includes every other row of pixel cells of the first column of pixel cells and the second subgroup of pixel cells includes every other row of pixel cells of the first column of pixel cells not included in the first subgroup of pixel cells.

32. The imaging system of claim 31,
wherein a source region of the second row select transistor of each pixel cell of the first subgroup of pixel cells is coupled to the first column bitline to bin the respective image signal at the source region of the first source follower transistor with a respective image signal generated by a pixel cell of another column of pixel cells that is coupled to the first column bitline when the second row select transistor is turned on,
wherein a source region of the second row select transistor of each pixel cell of the second subgroup of pixel cells is coupled to the second column bitline to bin the respective image signal at the source region of the first source follower transistor with a respective image signal generated by a pixel cell of another column that is coupled to the second column bitline when the second row select transistor is turned on.

33. The imaging system of claim 32, wherein the second row select transistor of each pixel cell of the first subgroup of pixel cells is disposed in the semiconductor material closer to the first column bitline than the first row select transistor, and wherein the second row select transistor of each pixel cell of the second subgroup of pixel cells is disposed in the semiconductor material closer to the second column bitline than the first row select transistor.

34. The imaging system of claim 32, wherein an arrangement of the first row select transistor relative to the second row select transistor in the semiconductor material is perpendicular relative to an alignment of the first and second column bitlines.

35. The imaging system of claim 32, wherein an arrangement of the first row select transistor relative to the second row select transistor in the semiconductor material is parallel relative to an alignment of the first and second column bitlines.

36. The imaging system of claim 29, wherein the first column of pixel cells is a neighboring column of the second column of pixel cells.

37. The imaging system of claim 29, wherein the plurality of columns of pixel cells further includes a third column of pixel cells, wherein the third column of pixel cells is disposed between the first column of pixel cells and the second column of pixel cells.

38. The imaging system of claim 24, wherein each of the pixel cells of the plurality of pixel cells further comprises:
a second floating diffusion; and
a dual conversion gain (DCG) transistor coupled between the first floating diffusion and the second floating diffusion, wherein said each of the pixel cells of the plurality of pixel cells is configured to be in high conversion gain (HCG) mode when the DCG transistor is turned off, and wherein said each of the plurality of pixel cells is configured to be in low conversion gain (LCG) mode when the DCG transistor is turned on.

39. The imaging system of claim 24, wherein each of the pixel cells of the plurality of pixel cells further comprises a reset transistor coupled between a voltage supply and the first floating diffusion.

* * * * *

UNITED STATES PATENT AND TRADEMARK OFFICE
CERTIFICATE OF CORRECTION

PATENT NO. : 11,652,131 B2
APPLICATION NO. : 17/066277
DATED : May 16, 2023
INVENTOR(S) : Sang Joo Lee et al.

It is certified that error appears in the above-identified patent and that said Letters Patent is hereby corrected as shown below:

In the Claims

In Column 25, Line 46, Claim 17, delete "first and second colors of are two" and insert -- first and second colors are two -- therefor.

In Column 25, Line 60, Claim 19, delete "green (G) green light," and insert -- green (G) light -- therefor.

Signed and Sealed this
Sixth Day of May, 2025

Coke Morgan Stewart
*Acting Director of the United States Patent and Trademark Office*